US010901049B2

(12) United States Patent
Furuichi et al.

(10) Patent No.: US 10,901,049 B2
(45) Date of Patent: Jan. 26, 2021

(54) MAGNETIC SENSOR AND METHOD FOR MANUFACTURING SAID MAGNETIC SENSOR

(71) Applicants: DENSO CORPORATION, Kariya (JP); TOHOKU UNIVERSITY, Sendai (JP)

(72) Inventors: Takamoto Furuichi, Kariya (JP); Kenichi Ao, Kariya (JP); Ryuichiro Abe, Kariya (JP); Yasuo Ando, Sendai (JP); Mikihiko Oogane, Sendai (JP); Takafumi Nakano, Sendai (JP)

(73) Assignees: DENSO CORPORATION, Kariya (JP); TOHOKU UNIVERSITY, Miyagi (JP)

(*) Notice: Subject to any disclaimer, the term of this patent is extended or adjusted under 35 U.S.C. 154(b) by 48 days.

(21) Appl. No.: 16/386,428

(22) Filed: Apr. 17, 2019

(65) Prior Publication Data

US 2019/0242957 A1    Aug. 8, 2019

Related U.S. Application Data

(63) Continuation of application No. PCT/JP2017/037844, filed on Oct. 19, 2017.

(30) Foreign Application Priority Data

Oct. 26, 2016  (JP) .................. 2016-209854

(51) Int. Cl.
*G01R 33/09* (2006.01)
*H01L 27/22* (2006.01)
(Continued)

(52) U.S. Cl.
CPC .......... *G01R 33/093* (2013.01); *G01R 33/06* (2013.01); *G01R 33/09* (2013.01); *H01F 10/325* (2013.01);
(Continued)

(58) Field of Classification Search
CPC ...... G01R 33/093; G01R 33/06; G01R 33/09; H01L 27/22; H01L 43/02; H01L 43/08; H01L 43/10; H01L 43/12
See application file for complete search history.

(56) References Cited

U.S. PATENT DOCUMENTS 6,221,172 B1    4/2001   Saito et al.
6,424,506 B1    7/2002   Saito et al.
(Continued)

FOREIGN PATENT DOCUMENTS

JP    2012-017990 A    1/2012
JP    2012-255796 A    12/2012

OTHER PUBLICATIONS

Y. C. Lee et al., "Magnetic tunnel junction based out-of-plane field sensor with perpendicular magnetic anisotropy in reference layer," Journal of Applied Physics 117, 17A320 (2015), 2015 AIP Publishing LLC. (Abstract only). <https://aip.scitation.org/doi/pdf/10.1063/1.4914121?class=pdf>.

*Primary Examiner* — Seahvosh Nikmanesh
(74) *Attorney, Agent, or Firm* — Posz Law Group, PLC

(57) ABSTRACT

A magnetic sensor includes: a substrate; and first and second magnetoresistive devices on one surface of the substrate. Each of the first and second magnetoresistive devices includes: a fixed layer having an easy magnetization axis perpendicular to the one surface and having a fixed magnetization direction; a free layer having a variable magnetization direction; and an intermediate layer made of a non-magnetic material and arranged between the fixed layer and the free layer. The fixed layer includes a first ferromagnetic layer, a second ferromagnetic layer, and a non-magnetic layer arranged between the first ferromagnetic layer and the second ferromagnetic layer.

9 Claims, 17 Drawing Sheets

(51) Int. Cl.
- *H01L 43/02* (2006.01)
- *H01F 10/32* (2006.01)
- *H01L 43/12* (2006.01)
- *H01F 41/34* (2006.01)
- *G01R 33/06* (2006.01)
- *H01L 43/08* (2006.01)
- *H01L 43/10* (2006.01)

(52) U.S. Cl.
CPC ..... *H01F 10/3254* (2013.01); *H01F 10/3286* (2013.01); *H01F 41/34* (2013.01); *H01L 27/22* (2013.01); *H01L 43/02* (2013.01); *H01L 43/08* (2013.01); *H01L 43/10* (2013.01); *H01L 43/12* (2013.01)

(56) References Cited

U.S. PATENT DOCUMENTS

| | | |
|---|---|---|
| 2001/0043447 A1 | 11/2001 | Saito et al. |
| 2002/0039266 A1 | 4/2002 | Saito et al. |
| 2002/0167769 A1 | 11/2002 | Saito et al. |
| 2003/0103299 A1 | 6/2003 | Saito |
| 2003/0107847 A1 | 6/2003 | Saito et al. |
| 2003/0169538 A1 | 9/2003 | Saito et al. |
| 2004/0141259 A1 | 7/2004 | Saito et al. |
| 2004/0165425 A1* | 8/2004 | Nakamura ............ H01L 27/224 365/171 |
| 2008/0074803 A1 | 3/2008 | Koyama et al. |
| 2016/0202330 A1 | 7/2016 | Yamamoto et al. |

\* cited by examiner

MAGNETIC SENSOR AND METHOD FOR MANUFACTURING SAID MAGNETIC SENSOR

CROSS REFERENCE TO RELATED APPLICATION

The present application is a continuation application of International Patent Application No. PCT/JP2017/037844 filed on Oct. 19, 2017, which designated the U.S. and claims the benefit of priority from Japanese Patent Application No. 2016-209854 filed on Oct. 26, 2016. The entire disclosures of all of the above applications are incorporated herein by reference.

TECHNICAL FIELD

The present disclosure relates to a magnetic sensor and a method for manufacturing the same.

BACKGROUND

In recent years, there have been suggested magnetic sensors including magnetoresistive devices, in which these magnetic sensors are adapted to change their outputs depending on magnetic field intensities. Such a magnetoresistive device includes a fixed layer having a fixed direction of magnetization, a free layer having a variable direction of magnetization, and an intermediate layer formed from a non-magnetic material which is placed between the fixed layer and the free layer. Thus, such a magnetoresistive device is adapted to change a resistance value therein depending on the angle formed between the direction of magnetization in the fixed layer and the direction of magnetization in the free layer.

SUMMARY

A magnetic sensor includes: a substrate; and first and second magnetoresistive devices on one surface of the substrate. Each of the first and second magnetoresistive devices includes: a fixed layer having an easy magnetization axis perpendicular to the one surface and having a fixed magnetization direction; a free layer having a variable magnetization direction; and an intermediate layer made of a non-magnetic material and arranged between the fixed layer and the free layer. The fixed layer includes a first ferromagnetic layer, a second ferromagnetic layer, and a non-magnetic layer arranged between the first ferromagnetic layer and the second ferromagnetic layer.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
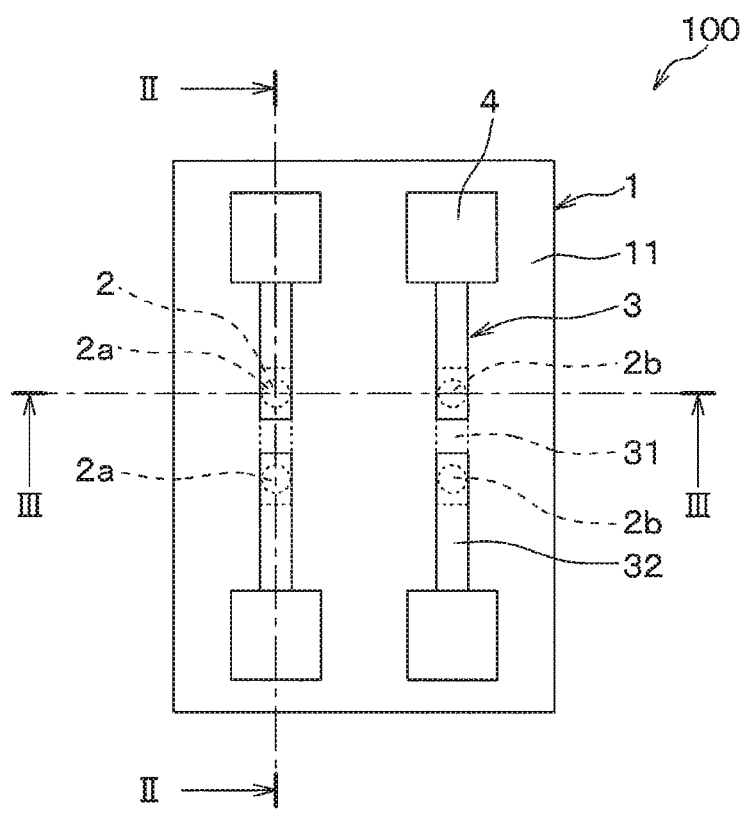
FIG. 1 is a plan view of a magnetic sensor according to a first embodiment.

In magnetic sensors, a plurality of magnetoresistive devices including respective fixed layers magnetized in directions opposite from each other are combined to form a bridge circuit, which can cancel temperature changes, thereby improving the accuracy. Accordingly, there has been a need for techniques for forming a plurality of magnetoresistive devices including respective fixed layers magnetized in directions opposite from each other, within the same chip.

However, in general, the directions of magnetization of the fixed layers are determined by magnetic field heat treatment performed on the entire chip and, therefore, are made to be the same within the same chip. Accordingly, in order to manufacture a plurality of magnetoresistive devices including respective fixed layers magnetized in directions opposite from each other, it is necessary to place, in combination, a plurality of magnetoresistive devices manufactured separately from each other, which complicates the process for manufacturing the magnetic sensor.

Further, a method is provided for controlling the directions of magnetization in magnetoresistive devices on a chip, in which an electric current is flown through wirings provided under fixed layers for magnetizing the fixed layers having magnetic anisotropy in in-plane directions, utilizing a magnetic field induced by the electric current.

However, according to the above method, the magnetic field in the in-plane direction is applied to the fixed layers Therefore, it is impossible to magnetize a plurality of magnetoresistive devices for magnetizing the fixed layers included in the respective magnetoresistive devices in directions opposite from each other, in a magnetic sensor including the plurality of the magnetoresistive devices having vertical magnetic anisotropy which are formed in the same chip.

Further, even when a bridge circuit is not formed, in manufacturing a magnetic sensor including a plurality of magnetoresistive devices including respective fixed layers magnetized in directions opposite from each other in the same chip, if the plural magnetoresistive devices manufactured separately from each other are placed in combination with each other, this complicates the process for manufacturing the magnetic sensor.

In view of the aforementioned circumstances, it is an object of the present disclosure to simplify a process for manufacturing a magnetic sensor including a plurality of magnetoresistive devices with vertical magnetic anisotropy which are formed within the same chip such that the magnetoresistive devices include respective fixed layers magnetized in directions opposite from each other.

According to an aspect of the present disclosure, a magnetic sensor includes: a substrate; and a first magnetoresistive device and a second magnetoresistive device that are arranged on one surface of the substrate. Each of the first magnetoresistive device and the second magnetoresistive device includes: a fixed layer having an easy magnetization axis perpendicular to the one surface and having a fixed magnetization direction; a free layer having a variable magnetization direction; and an intermediate layer made of a non-magnetic material and arranged between the fixed layer and the free layer. The fixed layer includes a first ferromagnetic layer, a second ferromagnetic layer, and a non-magnetic layer arranged between the first ferromagnetic layer and the second ferromagnetic layer. The first ferromagnetic layer in the first magnetoresistive device has a magnetization amount larger than a magnetization amount of the second ferromagnetic layer in the first magnetoresistive device. The first ferromagnetic layer in the second magnetoresistive device has a magnetization amount smaller than a magnetization amount of the second ferromagnetic layer in the second magnetoresistive device.

In the antiferromagnetic coupling configuration including the first ferromagnetic layer, the non-magnetic layer, and the second ferromagnetic layer, the layer which is magnetized in a larger amount, out of the first and second ferromagnetic layers, is magnetized in the same direction as that of the external magnetic field applied thereto during the magnetization. Further, the layer which is magnetized in a smaller amount is magnetized in the opposite direction from that of the layer which is magnetized in a larger amount, due to the antiferromagnetic coupling.

Therefore, in the state where the respective magnitude correlations in amount of magnetization between the two ferromagnetic layers in the two magnetoresistive devices are opposite from each other, by performing magnetization on the fixed layers in these two magnetic resistance devices at the same time, it is possible to magnetize, in directions opposite from each other, the ferromagnetic layers adjacent to the intermediate layers in these two magnetoresistive devices. This can simplify the process for manufacturing the magnetic sensor including the plural magnetoresistive devices with vertical magnetic anisotropy which are formed in the same chip, such that the magnetoresistive devices include the respective fixed layers magnetized in directions opposite from each other, Further, since the ferromagnetic layers adjacent to the respective intermediate layers in these two magnetoresistive devices are magnetized in the directions opposite from each other, the increase and decrease of the resistance value in the portion constituted by the ferromagnetic layers, the intermediate layer and the free layer in one of the two magnetoresistive devices is made opposite from those in the other magnetoresistive device. Accordingly, by forming a Wheatstone bridge circuit using two first magnetoresistive devices and two second magnetoresistive devices, it is possible to cancel temperature changes and the like in the output, thereby improving the measurement accuracy.

According to another aspect of the present disclosure, a method for manufacturing a magnetic sensor, includes: forming a first magnetoresistive device on one surface of a substrate; and forming a second magnetoresistive device on the one surface. Each of the forming of the first magnetoresistive device and the forming of the second magnetoresistive device includes: forming a fixed layer having a first ferromagnetic layer, a second ferromagnetic layer, and a non-magnetic layer arranged between the first ferromagnetic layer and the second ferromagnetic layer, having an easy magnetization axis perpendicular to the one surface, and having a fixed magnetization direction; forming an intermediate layer made of a non-magnetic material on an upper surface of the first ferromagnetic layer; and forming a free layer having a variable magnetization direction on an upper surface of the intermediate layer; and in the forming of the fixed layer, the first ferromagnetic layer in the first magnetoresistive device has a magnetization amount larger than a magnetization amount of the second ferromagnetic layer in the first magnetoresistive device, and the first ferromagnetic layer in the second magnetoresistive device has a magnetization amount smaller than a magnetization amount of the second ferromagnetic layer in the second magnetoresistive device.

By forming the fixed layers such that the magnitude correlation in amount of magnetization between the two ferromagnetic layers in one of the two magnetoresistive devices is opposite from that in the other magnetoresistive devices, as described above, the ferromagnetic layers adjacent to the respective intermediate layers in these two magnetoresistive devices are magnetized in the directions opposite from each other. This can simplify the process for manufacturing the magnetic sensor including the plural magnetoresistive devices with vertical magnetic anisotropy which are formed in the same chip, such that the magnetoresistive devices include the respective fixed layers magnetized in directions opposite from each other.

Hereinafter, embodiments of the present disclosure will be described with reference to the drawings. Further, throughout the embodiments which will be described later, the same or equivalent portions will be designated by the same reference characters.

First Embodiment

A first embodiment will be described. As illustrated in FIG. 1, a magnetic sensor 100 according to the present embodiment includes a substrate 1, magnetoresistive devices 2, wirings 3 and pads 4. Further, in FIG. 1, there is not illustrated a protective film 7 which will be described later.

The substrate 1 is formed from silicon and the like, and on one surface 11 of the substrate 1, there are formed a plurality of the magnetoresistive devices 2. As will be described later, the magnetoresistive devices 2 include a fixed layer 21 including a ferromagnetic layer 211 and the like, and the magnetic sensor 100 includes magnetoresistive devices 2a including a ferromagnetic layer 211 magnetized in one direction, out of the directions normal to the one surface 11, and magnetoresistive devices 2b including that magnetized in the other direction. The magnetoresistive devices 2a and 2b correspond to a first magnetoresistive device and a second magnetoresistive device.

The magnetic sensor 100 according to the present embodiment includes two magnetoresistive devices 2a, two magnetoresistive devices 2b, and four pads 4. Further, the two magnetoresistive devices 2a are connected to the pads 4 through the wirings 3.

Figure 2:
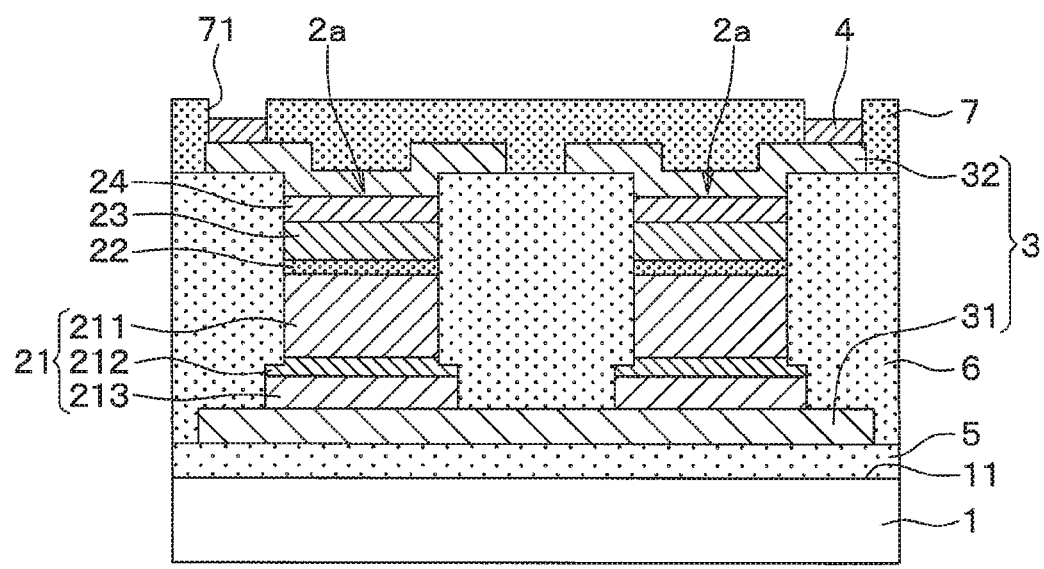
FIG. 2 is a cross-sectional view taken along a line II-II in FIG. 1.

More specifically, as illustrated in FIG. 2, the magnetic sensor 100 includes an insulation film 5, a sidewall protective film 6, and a protective film 7, in addition to the substrate 1 and the like, and the wirings 3 include a lower-portion wiring layer 31 and an upper-portion wiring layer 32.

The insulation film 5 is formed on the one surface 11, in order to electrically insulate the substrate 1 and the lower-portion wiring layer 31 from each other. The insulation film 5 is formed from, for example, $SiO_2$ and the like. The lower-portion wiring layer 31 is formed on the upper surface of the insulation film 5, and the two magnetoresistive devices 2a are placed in a state of being spaced apart from each other, on the upper surface of the lower-portion wiring layer 31. The lower-portion wiring layer 31 is formed from, for example, Cu, Au, and the like.

The sidewall protective film 6 is formed from, for example, $Al_2O_3$ and the like, and is formed in such a way as to cover the insulation film 5, the lower-portion wiring layer 31, and the magnetoresistive devices 2a. However, the upper surfaces of the magnetoresistive devices 2a are not covered with the sidewall protective film 6, and the upper-portion wiring layer 32 is formed on the upper surfaces of the magnetoresistive devices 2a and on the upper surface of the sidewall protective film 6. The upper-portion wiring layer 32 is formed from, for example, Cu, Au, and the like.

The pads 4 are formed on the upper surface of the upper-portion wiring layer 32. One of the magnetoresistive devices 2a is connected to one of the four pads 4 through the upper-portion wiring layer 32, and the other magnetoresistive device 2a is connected to another pad 4 through the upper-portion wiring layer 32. Further, the two magnetoresistive devices 2b are similarly connected to the pads 4 through the wirings 3.

The protective film 7 is formed on the surfaces of the sidewall protective film 6, the upper-portion wiring layer 32, and the pads 4. However, on the upper portions of the pads 4, the protective film 7 is partially removed to form openings 71, thereby exposing the pads 4.

The four magnetoresistive devices 2 are connected to a power source and the like, which are not illustrated, through the wirings 3, the pads 4 and bonding wires connected to the pads 4, which are not illustrated.

Figure 3:
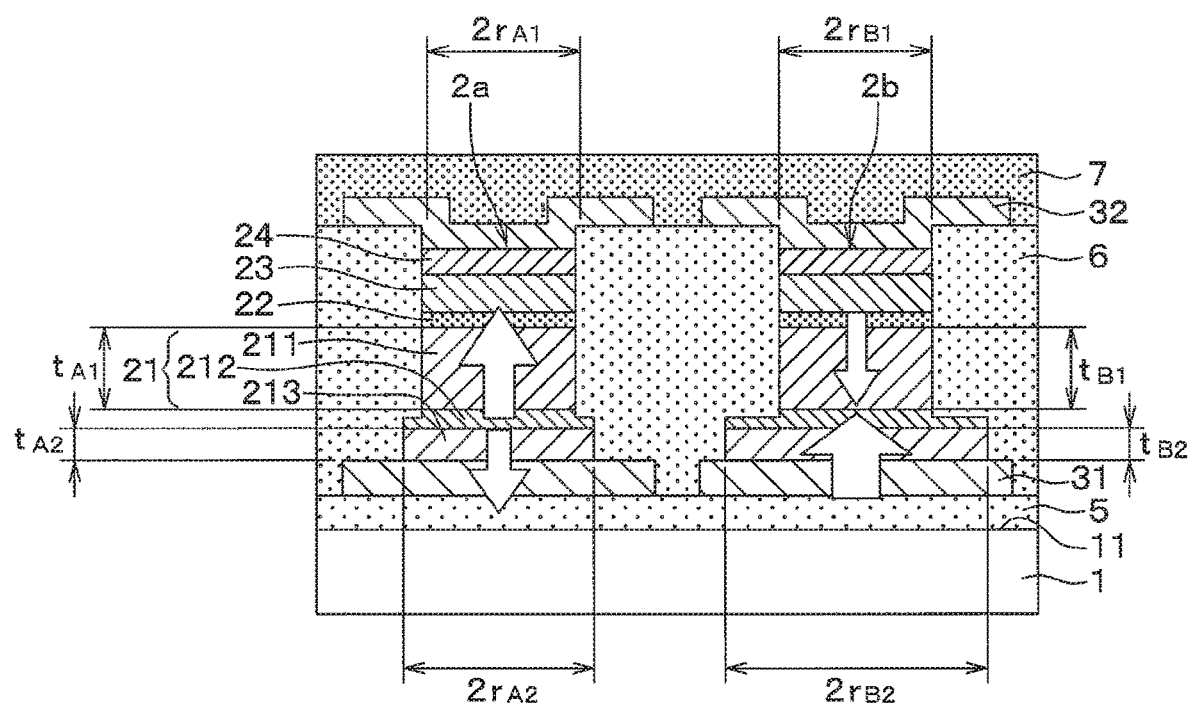
FIG. 3 is a cross-sectional view taken along a line III-III in FIG. 1.

The magnetoresistive devices 2 will be described in detail. As illustrated in FIGS. 2 and 3, the magnetoresistive devices 2 include the fixed layer 21, an intermediate layer 22, a free layer 23, and a cap layer 24, and these layers are laminated in order on the upper surface of the lower-portion wiring layer 31.

The fixed layer 21 has an axis of easy magnetization perpendicular to the one surface 11, and the direction of magnetization thereof is fixed. More specifically, the fixed layer 21 includes the ferromagnetic layer 211, a non-magnetic layer 212 and a ferromagnetic layer 213, and these layers are laminated on the lower-portion wiring layer 31, in the order of the ferromagnetic layer 213, the non-magnetic layer 212, and the ferromagnetic layer 211. The ferromagnetic layers 211 and 213 correspond to a first ferromagnetic layer and a second ferromagnetic layer, respectively.

The ferromagnetic layer 211 is a ferromagnetic film having a fixed direction of magnetization which is perpendicular to the one surface 11. As illustrated by arrows in FIG. 3, the direction of magnetization of the ferromagnetic layer 211 included in each magnetoresistive device 2a is opposite from the direction of magnetization of the ferromagnetic layer 211 included in each magnetoresistive device 2b. In the present embodiment, the ferromagnetic layers 211 included in the magnetoresistive devices 2a and 2b have been magnetized, in the direction from the ferromagnetic layer 213 to the ferromagnetic layer 211 (in the upward direction in the paper plane of FIG. 3) and in the direction from the ferromagnetic layer 211 to the ferromagnetic layer 213 (in the downward direction in the paper plane of FIG. 3), respectively.

The ferromagnetic layer 211 is formed from a Co/Pt multi-layer film or a Co/Pd multi-layer film, for example. Also, the ferromagnetic layer 211 may be formed from a thin film formed from a CoCr alloy and Pt, Ta, B, Nb, and the like which are added thereto, or from a thin film configured to include magnetic films with respective different compositions which are laminated. Also, the ferromagnetic layer 211 may be formed from a laminated magnetic film formed from a Co/Pt (or Pd) multi-layer film and a Co-Xa/(Pt or Pd) multi-layer film (in which Xa is Cr, B, Ta, Mn, or V). Also, the ferromagnetic layer 211 may be formed from a laminated magnetic film formed from a Co/(Pt or Pd) multi-layer film and a Co/{(Pt-Ya) or (Pd-Ya)} multi-layer film (in which Ya is B, Ta, Ru, Re, Ir, Mn, Mg, Zr, or Nb). Also, the ferromagnetic layer 211 may be formed from a laminated magnetic film formed from a CoCr alloy film and a Co/(Pt or Pd) multi-layer film, an FePt alloy, a CoPt alloy, a CoFeB thin film, and the like.

The non-magnetic layer 212 is a thin film formed from a non-magnetic material such as Ru.

The ferromagnetic layer 213 is a ferromagnetic film having a fixed direction of magnetization perpendicular to the one surface 11 and has been magnetized in the opposite direction from that of the ferromagnetic layer 211. Namely, as illustrated by the arrows in FIG. 3, the direction of magnetization of the ferromagnetic layer 213 included in each magnetoresistive device 2a is opposite from the direction of magnetization of the ferromagnetic layer 213 included in each magnetoresistive device 2b. In the present embodiment, the ferromagnetic layers 213 included in the magnetoresistive devices 2a and 2b have been magnetized, in the downward direction in the paper plane of FIG. 3 and in the upward direction in the paper plane of FIG. 3, respectively. As described above, the fixed layer 21 has a so-called antiferromagnetic coupling configuration including the non-magnetic layer 212 interposed between the ferromagnetic layers 211 and 213 which have been magnetized in the opposite directions parallel to each other. The ferromagnetic layer 213 is formed from the same material as that of the ferromagnetic layer 211, for example.

The amount of magnetization of the ferromagnetic layer 211 included in each magnetoresistive device 2a is made larger than the amount of magnetization of the ferromagnetic layer 213 included in each magnetoresistive device 2a. The amount of magnetization of the ferromagnetic layer 211 included in each magnetoresistive device 2b is made smaller than the amount of magnetization of the ferromagnetic layer 213 included in each magnetoresistive device 2b. Namely, assuming that the respective amounts of magnetization of the ferromagnetic layers 211 and 213 included in each magnetoresistive device 2a are $M_{A1}$ and $M_{A2}$, and the respective amounts of magnetization of the ferromagnetic layers 211 and 213 included in each magnetoresistive device 2b are $M_{B1}$ and $M_{B2}$, there are held the following relationships: $M_{A2} < M_{A1}$ and $M_{B1} < M_{B2}$ The amount of magnetization is expressed as the product of the volume and the amount of magnetization per unit volume. Accordingly, there are held the following relationships: $M_{A1} = Ms_{A1} \times V_{A1}$, $M_{A2} = Ms_{A2} \times V_{A2}$, $M_{B1} = Ms_{B1} \times V_{B1}$, and $M_{B2} = Ms_{B2} \times V_{B2}$ Incidentally, $Ms_{A1}$ and $Ms_{A2}$ are the respective amounts of magnetization per unit volume of the ferromagnetic layers 211 and 213 included in the magnetoresistive devices 2a, and $V_{A1}$ and $V_{A2}$ are the respective volumes of the ferromagnetic layers 211 and 213 included in the magnetoresistive devices 2a. Further, $Ms_{B1}$ and $Ms_{B2}$ are the respective amounts of magnetization per unit volume of the ferromagnetic layers 211 and 213 included in the magnetoresistive devices 2b, and $V_{B1}$ and $V_{B2}$ are the respective volumes of the ferromagnetic layers 211 and 213 included in the magnetoresistive devices 2b.

In the present embodiment, the ferromagnetic layers 211 and 213 included in the magnetoresistive devices 2a and the ferromagnetic layers 211 and 213 included in the magnetoresistive devices 2b are formed from the same material, so that there is held the following relationship: $Ms_{A1} = Ms_{A2} = Ms_{B1} = Ms_{B2}$ Further, $V_{A2}$ is made smaller than $V_{A1}$, and $V_{B1}$ is made smaller than $V_{B2}$, and, therefore, $M_{A2}$ is made smaller than $M_{A1}$, and $M_{B1}$ is made smaller than $M_{B2}$.

Further, in the present embodiment, the ferromagnetic layers 211 and 213 are each made to have a circular-cylindrical shape. Namely, there are held the following relationships: $V_{A1} = S_{A1} \times t_{A1}$, $V_{A2} = S_{A2} \times t_{A2}$, $V_{B1} = S_{B1} \times t_{B1}$, and $V_{B2} = S_{B2} \times t_{B2}$ Further, $S_{A1}$ and $S_{A2}$ are the area of the upper surface of the ferromagnetic layer 211 included in each magnetoresistive device 2a, and the area of the bottom surface of the ferromagnetic layer 213 included in each magnetoresistive devices 2a, respectively. Further, $S_{B1}$ and $S_{B2}$ are the area of the upper surface of the ferromagnetic layer 211 included in each magnetoresistive device 2b and the area of the bottom surface of the ferromagnetic layer 213 included in each magnetoresistive device 2b, respectively. Further, $t_{A1}$ and $t_{A2}$ are the respective film thicknesses of the ferromagnetic layers 211 and 213 included in the magnetoresistive devices 2a, and $t_{B1}$ and $t_{B2}$ are the respective film thicknesses of the ferromagnetic layers 211 and 213 included in the magnetoresistive devices 2b.

Further, in the present embodiment, $r_{A1}$ is made smaller than $r_{A2}$, and $r_{B1}$ is made smaller than $r_{B2}$. Namely, $S_{A1}$ is made smaller than $S_{A2}$, and $S_{B1}$ is made smaller than $S_{B2}$. Incidentally, $r_{A1}$ and $r_{A2}$ are the radius of the upper surface of the ferromagnetic layer 211 included in each magnetoresistive device 2a, and the radius of the bottom surface of the ferromagnetic layer 213 included in each magnetoresistive device 2a, respectively. Further, $r_{B1}$ and $r_{B2}$ are the radius of the upper surface of the ferromagnetic layer 211 included in each magnetoresistive device 2b, and the radius of the bottom surface of the ferromagnetic layer 213 included in each magnetoresistive device 2b, respectively.

Further, in the present embodiment, $r_{A1}$ is made equal to $r_{B1}$, and $t_{A1}$ is made equal to $t_{B1}$. Namely, there is held the following relationship: $S_{A2} \times t_{A2} < S_{A1} \times t_{A1} = S_{B1} \times t_{B1} < S_{B2} \times t_{B2}$. Further, in the present embodiment, $t_{A2}$ is made equal to $t_{B2}$, and $r_{A2}$ and $r_{B2}$ are set in such a way as to hold the following relationship: $S_{A2} < S_{B2}$, namely $r_{A2} < r_{B2}$.

Further, in the present embodiment, the non-magnetic layer 212 included in each magnetoresistive device 2a is made to have a stepped circular cylindrical shape which has an upper surface having a circular shape with a radius of $r_{A1}$ and also has a bottom surface having a circular shape with a radius of $r_{A2}$. Further, the non-magnetic layer 212 included in each magnetoresistive device 2b is made to have a stepped circular cylindrical shape which has an upper surface having a circular shape with a radius of $r_{B1}$ and also has a bottom surface having a circular shape with a radius of $r_{B2}$.

The intermediate layer 22 is formed on the upper surface of the fixed layer 21. The intermediate layer 22 is formed from a non-magnetic material and is formed from, for example, an insulating material such as MgO and AlO. In this case, the magnetic sensor 1 is structured to form a tunneling magneto resistance (TMR) device. Alternatively, the intermediate layer 22 can be formed from, for example, a conductive material such as Cu and Ag. In this case, the magnetic sensor 1 is structured to form a giant magneto resistance (GMR) device. Further, the intermediate layer 22 may be also formed from a semiconductor.

The free layer 23 is formed on the upper surface of the intermediate layer 22. The free layer 23 is adapted such that the direction of magnetization thereof is variable and has an axis of easy magnetization parallel to the one surface 11, in the present embodiment. When the free layer 23 is adapted to have in-plane magnetic anisotropy as described above, the free layer 23 induces moderate magnetization reversal therein, in detecting external magnetic fields in the direction perpendicular to the one surface 11, which corresponds to the direction of the axis of hard magnetization. This enables detection of magnetic field intensities over a wider magnetic field range.

The free layer 23 can be formed from, for example, an alloy in an amorphous state which contains B and at least one of Fe, Co, and Ni, and the like. The cap layer 24 is for protecting the free layer 23 and is formed from Ta, Ru, and the like.

The upper surfaces of the intermediate layer 22, the free layer 23, and the cap layer 24 are made to have a circular shape, and the radius thereof is made equal to the radius of the upper surface of the ferromagnetic layer 211. Namely, the radius of the upper surfaces of the intermediate layer 22, the free layer 23, and the cap layer 24 which are included in each magnetoresistive device 2a is made to be $r_{A1}$, and the radius of the upper surfaces of the intermediate layer 22, the free layer 23, and the cap layer 24 which are included in each magnetoresistive device 2b is made to be $r_{B1}$.

A method for manufacturing the magnetic sensor 100 will be described. The magnetic sensor 100 is manufactured by performing processes illustrated in FIGS. 4A to 6.

Figure 4A:
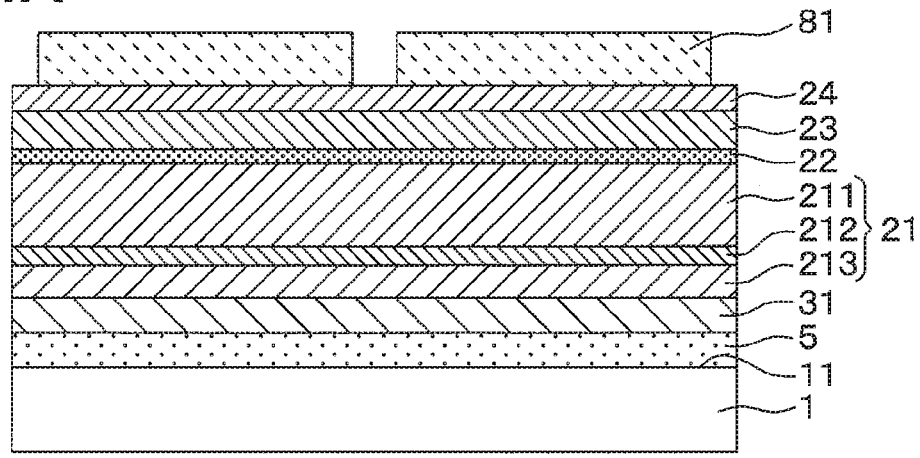
FIG. 4A is a cross-sectional view taken along the line III-III in FIG. 1, illustrating a step of manufacturing the magnetic sensor.

In a step illustrated in FIG. 4A, an insulation film 5, a lower-portion wiring layer 31, a ferromagnetic layer 213, a non-magnetic layer 212 and a ferromagnetic layer 211 in a fixed layer 21, an intermediate layer 22, a free layer 23, and a cap layer 24 are formed in the mentioned order on one surface 11 of a substrate 1. Further, on the upper surface of the cap layer 24, a resist 81 is formed through photolithography. The resist 81 is made to have a shape conforming to the upper surface shape of the lower-portion wiring layer 31 illustrated in FIG. 1.

Figure 4B:
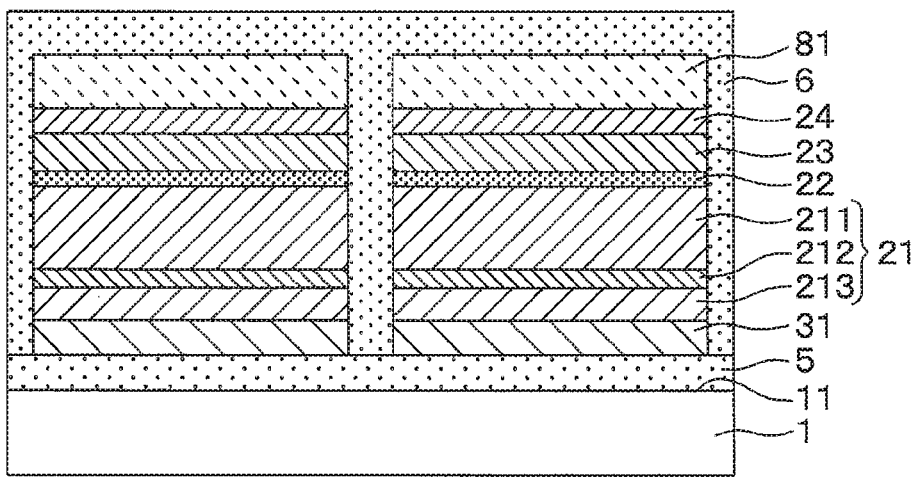
FIG. 4B is a cross-sectional view taken along the line III-III in FIG. 1, illustrating a step of manufacturing the magnetic sensor, subsequently to FIG. 4A.

In a step illustrated in FIG. 4B, the lower-wiring layer 31, the fixed layer 21, the intermediate layer 22, the free layer 23, and the cap layer 24 are partially removed, through etching using the resist 81 as a mask, so that the lower-portion wiring layer 31 is made to have the shape illustrated in FIG. 1. Further, a sidewall protective film 6 is formed through sputtering, CVD, or the like, such that it covers the insulation film 5 exposed as a result of the etching, the lower-portion wiring layer 31, the fixed layer 21, the intermediate layer 22, the free layer 23, the cap layer 24, and the resist 81.

Figure 4C:
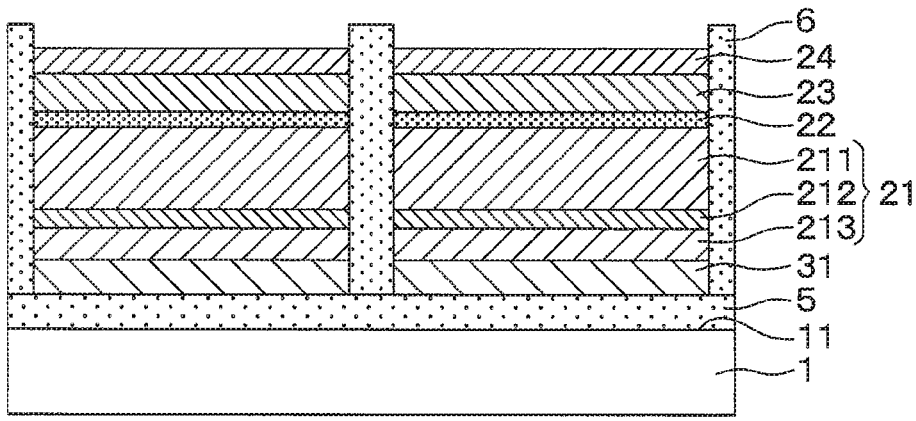
FIG. 4C is a cross-sectional view taken along the line III-III in FIG. 1, illustrating a step of manufacturing the magnetic sensor, subsequently to FIG. 4B.

In a step illustrated in FIG. 4C, the resist 81 is removed, and the sidewall protective film 6 is removed at its portions formed on the upper portion of the resist 81 through lift-off.

Figure 4D:
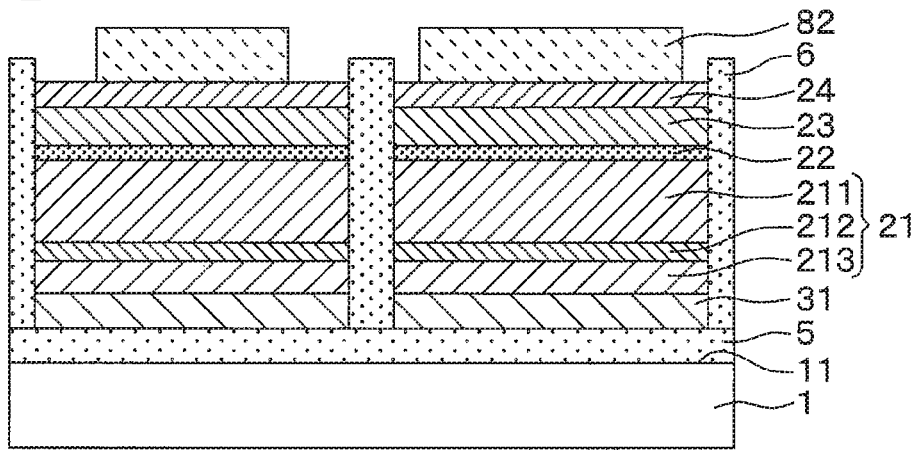
FIG. 4D is a cross-sectional view taken along the line III-III in FIG. 1, illustrating a step of manufacturing the magnetic sensor, subsequently to FIG. 4C.

In a step illustrated in FIG. 4D, a resist 82 is formed on the upper surface of the cap layer 24 through photolithography. The resist 82 is formed to have a shape conforming to the ferromagnetic layers 213 in the magnetoresistive devices 2a and 2b. More specifically, the portion of the resist 82, which corresponds to each magnetoresistive device 2a, is made to have an upper surface having a circular shape with a radius of $r_{A2}$, and the portion thereof, which corresponds to each magnetoresistive device 2b, is made to have an upper surface having a circular shape with a radius of $r_{B2}$.

Figure 4E:
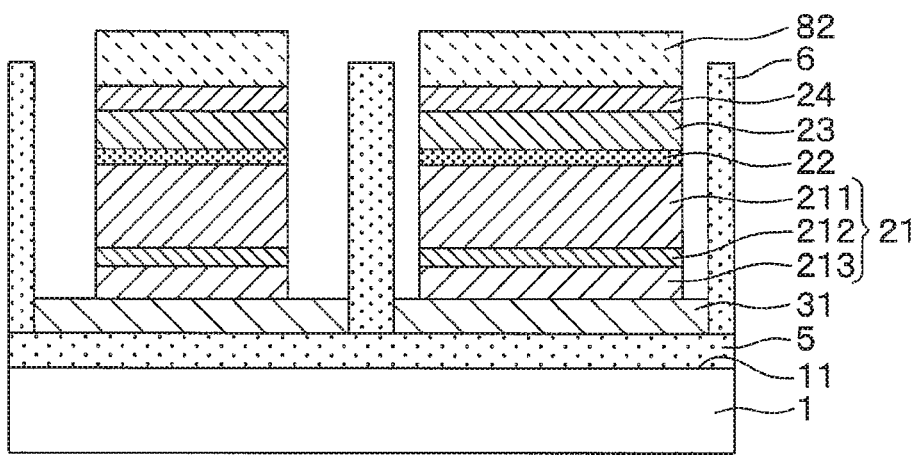
FIG. 4E is a cross-sectional view taken along the line III-III in FIG. 1, illustrating a step of manufacturing the magnetic sensor, subsequently to FIG. 4D.

In a step illustrated in FIG. 4E, the respective layers, which are the fixed layer 21 up to the cap layer 24, are removed at their portions which are not covered with the resist 82, through etching such as ion milling, for example. As a result thereof, the fixed layer 21 up to the cap layer 24 are made to have a circular cylindrical shape having an upper surface with a radius $r_{A2}$ at their portions corresponding to each magnetoresistive device 2a. Further, the fixed layer 21 up to the cap layer 24 are made to have a circular cylindrical shape having an upper surface with a radius $r_{B2}$ at their portions corresponding to each magnetoresistive device 2b.

Figure 4F:
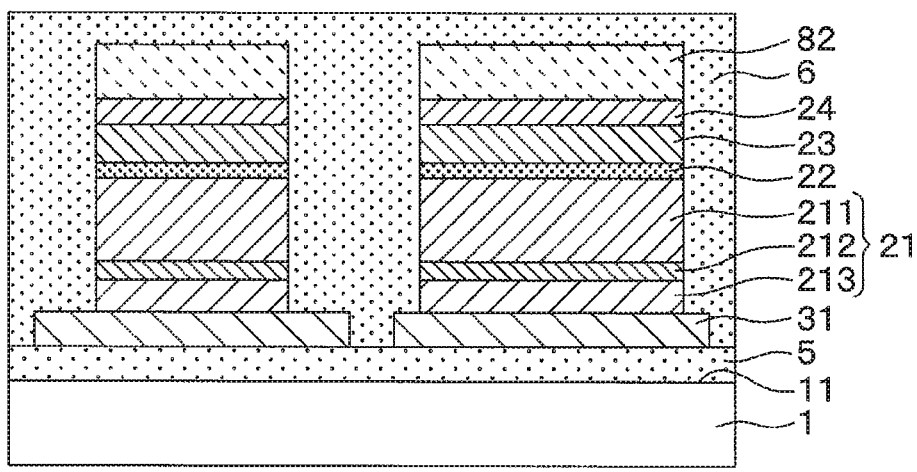
FIG. 4F is a cross-sectional view taken along the line III-III in FIG. 1, illustrating a step of manufacturing the magnetic sensor, subsequently to FIG. 4E.

In a step illustrated in FIG. 4F, a sidewall protective film 6 is formed through sputtering, CVD, or the like, such that it covers the surfaces of the insulation film 5, the lower-portion wiring layer 31, the fixed layer 21, the intermediate layer 22, the free layer 23, the cap layer 24, and the resist 82.

Figure 4G:
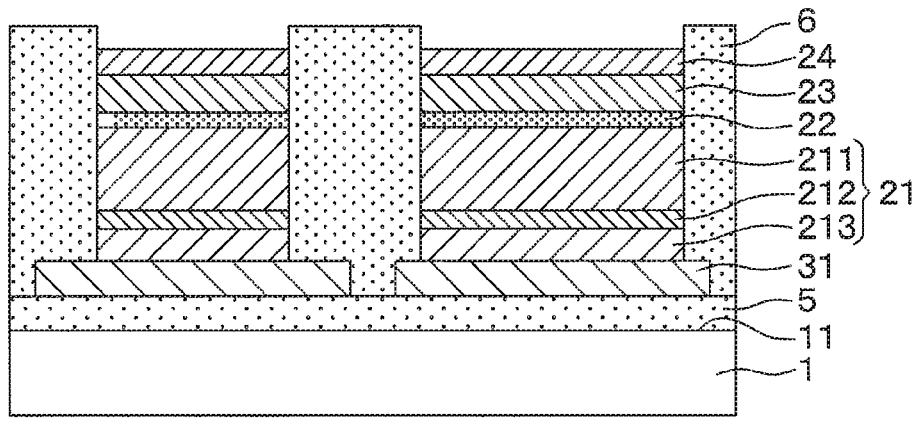
FIG. 4G is a cross-sectional view taken along the line III-III in FIG. 1, illustrating a step of manufacturing the magnetic sensor, subsequently to FIG. 4F.

In a step illustrated in FIG. 4G, the resist 82 is removed, and the sidewall protective film 6 is removed at its portions formed on the upper portion of the resist 82 through lift-off.

Figure 4H:
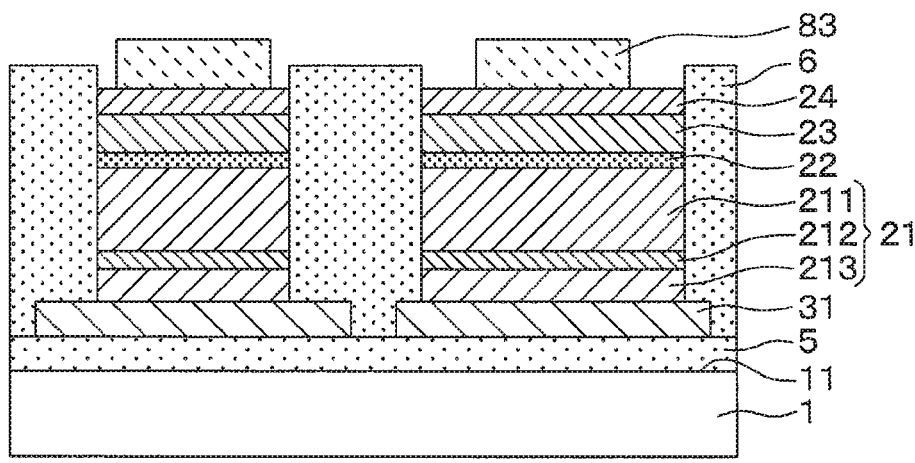
FIG. 4H is a cross-sectional view taken along the line III-III in FIG. 1, illustrating a step of manufacturing the magnetic sensor, subsequently to FIG. 4G.

In a step illustrated in FIG. 4H, a resist 83 is formed on the upper surface of the cap layer 24 through photolithography. The resist 83 is formed to have a shape conforming to the ferromagnetic layers 211 in the magnetoresistive devices 2a and 2b. More specifically, the portion of the resist 83, which corresponds to each magnetoresistive device 2a, is made to have an upper surface having a circular shape with a radius of $r_{A1}$, and the portion thereof, which corresponds to each magnetoresistive device 2b, is made to have an upper surface having a circular shape with a radius of $r_{B1}$.

Figure 4I:
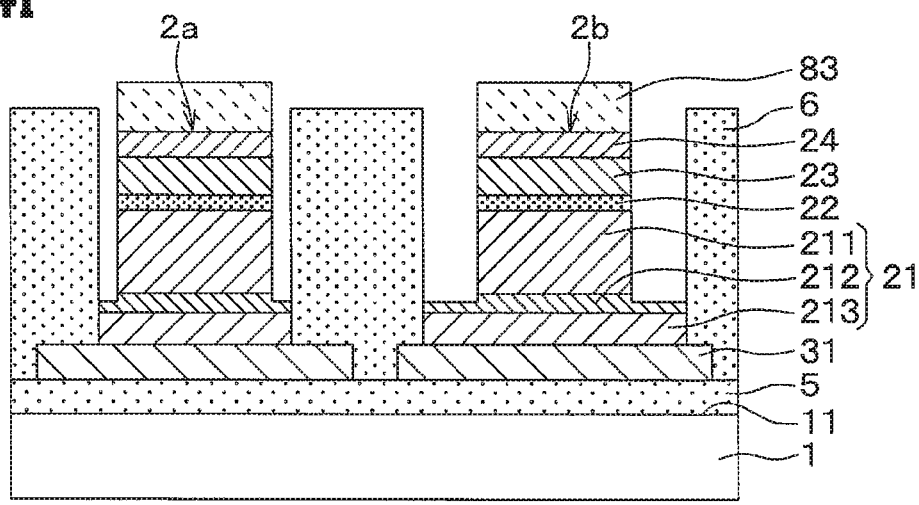
FIG. 4I is a cross-sectional view taken along the line III-III in FIG. 1, illustrating a step of manufacturing the magnetic sensor, subsequently to FIG. 4H.

In a step illustrated in FIG. 4I, at least the cap layer 24, the free layer 23, the intermediate layer 22, and the ferromagnetic layer 211 are partially removed, at their portions which are not covered with the resist 83, through etching. In the present embodiment, the etching is performed while elements contained in the atmosphere are analyzed. If an element forming the non-magnetic layer 212 is detected, then the etching is stopped. Thus, the cap layer 24, the free layer 23, the intermediate layer 22, the ferromagnetic layer 211, and a portion of the non-magnetic layer 212 are partially removed.

As a result thereof, the magnetoresistive devices 2a and the magnetoresistive devices 2b are formed. Further, in the magnetoresistive devices 2a, the ferromagnetic layer 211, the intermediate layer 22, the free layer 23, and the cap layer 24 are made to have respective upper surfaces with a circular shape with a radius of $r_{A1}$. Further, in the magnetoresistive devices 2a, the non-magnetic layer 212 is made to have a stepped cylindrical shape having an upper surface with a radius of $r_{A1}$ and a bottom surface with a radius of $r_{A2}$, and the ferromagnetic layer 213 is made to have a bottom surface with a circular shape with a radius of $r_{A2}$. Further, in the magnetoresistive devices 2b, the ferromagnetic layer 211, the intermediate layer 22, the free layer 23 and the cap layer 24 are made to have respective upper surfaces with a circular shape with a radius of $r_{B1}$. Further, in the magnetoresistive devices 2b, the non-magnetic layer 212 is made to have a stepped cylindrical shape having an upper surface with a radius of $r_{B1}$ and a bottom surface with a radius of $r_{B2}$, and the ferromagnetic layer 213 is made to have a bottom surface with a circular shape with a radius of $r_{B2}$.

Figure 4J:
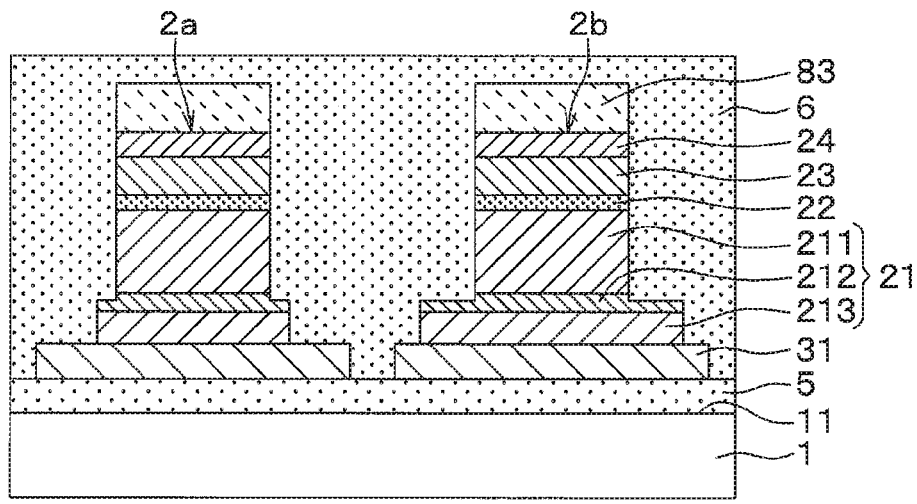
FIG. 4J is a cross-sectional view taken along the line III-III in FIG. 1, illustrating a step of manufacturing the magnetic sensor, subsequently to FIG. 4I.

In a step illustrated in FIG. 4J, a sidewall protective film 6 is formed through sputtering, CVD or the like, such that it covers the insulation film 5, the lower-portion wiring layer 31, the magnetoresistive devices 2a and 2b, and the surface of the resist 83.

Figure 4K:
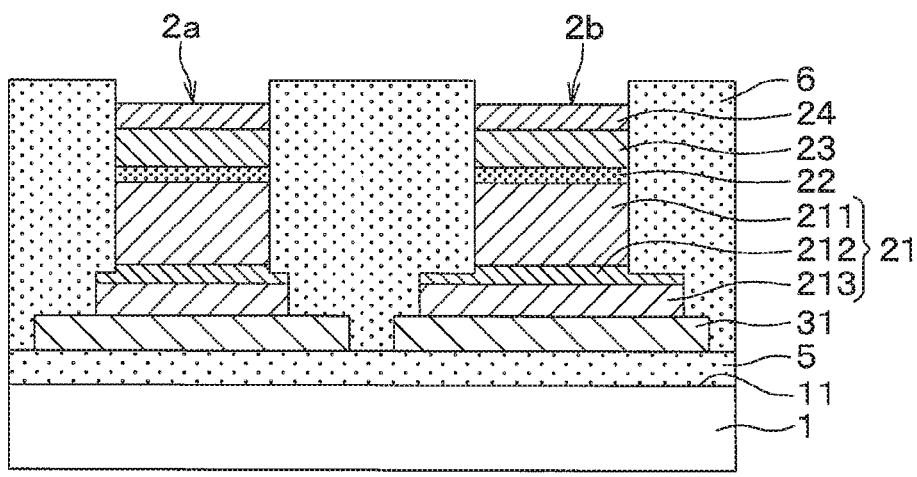
FIG. 4K is a cross-sectional view taken along the line III-III in FIG. 1, illustrating a step of manufacturing the magnetic sensor, subsequently to FIG. 4J.

In a step illustrated in FIG. 4K, the resist 83 is removed, and the sidewall protective film 6 is removed at its portions formed on the upper portion of the resist 83 through lift-off.

Figure 4L:
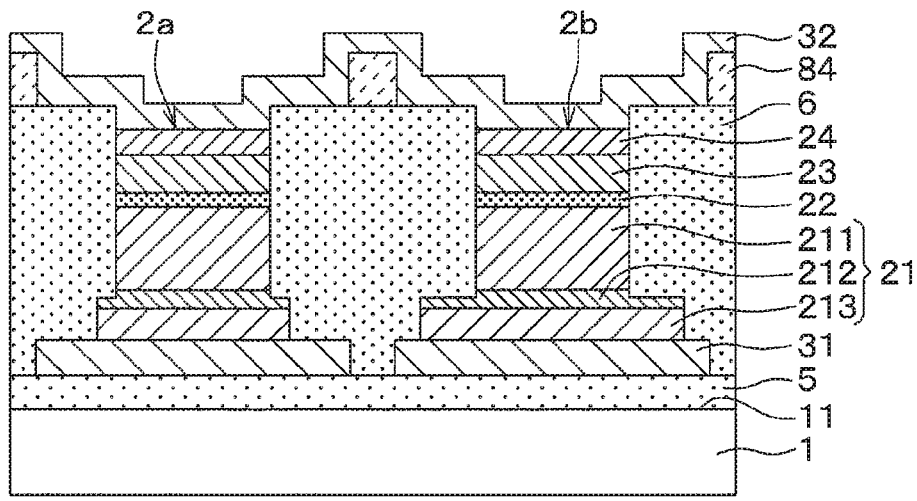
FIG. 4L is a cross-sectional view taken along the line in FIG. 1, illustrating a step of manufacturing the magnetic sensor, subsequently to FIG. 4K.
Figure 5A:
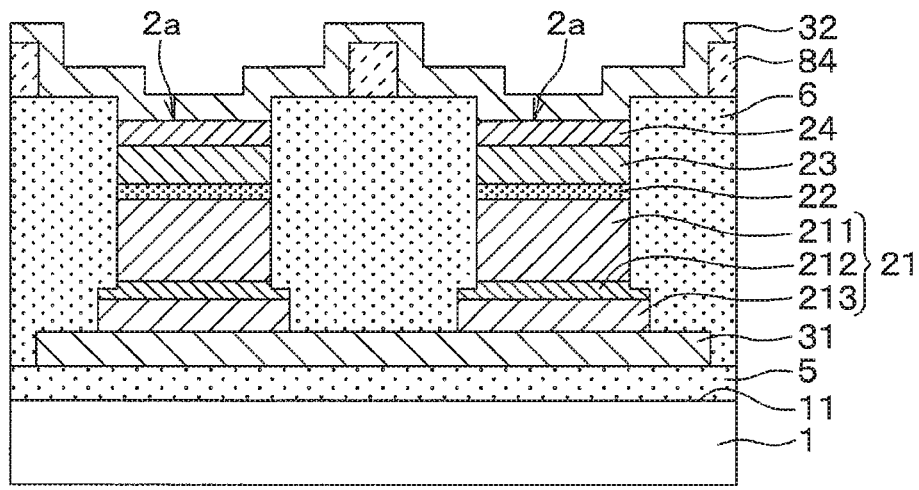
FIG. 5A is a cross-sectional view taken along the line II-II in FIG. 1, illustrating a step of manufacturing the magnetic sensor.

In steps illustrated in FIGS. 4L and 5A, a resist 84 is formed on the upper surface of the sidewall protective film 6, through photolithography. The resist 84 is provided with openings conforming to the upper-surface shape of the upper-portion wiring layer 32 illustrated in FIG. 1. After the formation of the resist 84, an upper-portion wiring layer 32 is formed on the surfaces of the cap layer 24, the sidewall protective film 6, and the resist 84.

Figure 4M:
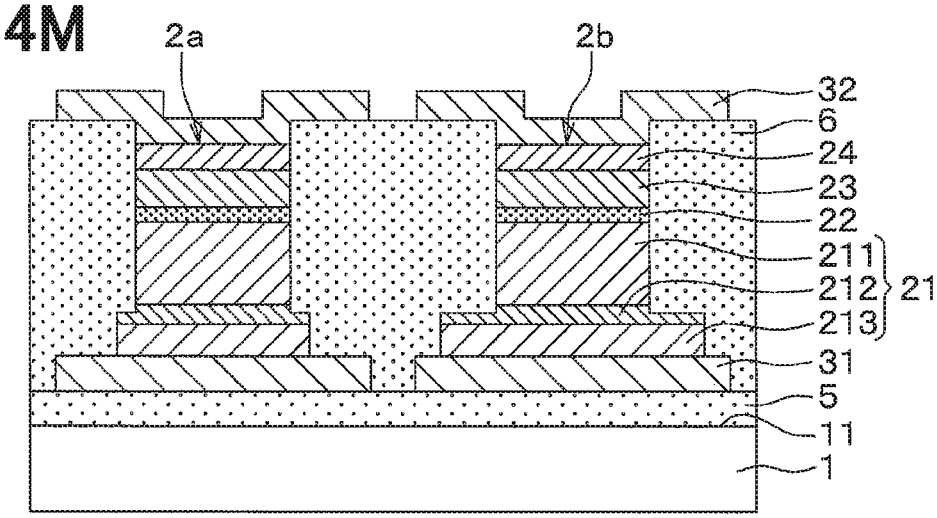
FIG. 4M is a cross-sectional view taken along the line III-III in FIG. 1, illustrating a step of manufacturing the magnetic sensor, subsequently to FIG. 4L.
Figure 5B:
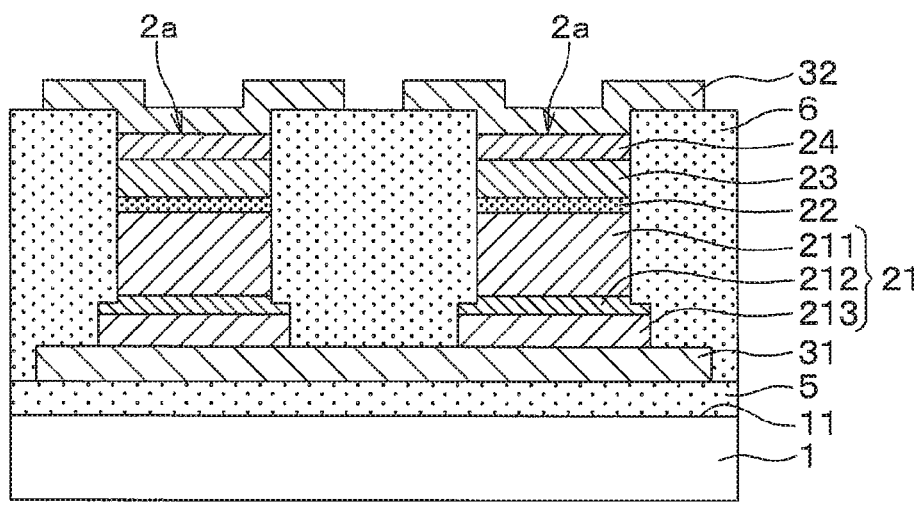
FIG. 5B is a cross-sectional view taken along the line II-II in FIG. 1, illustrating a step of manufacturing the magnetic sensor, subsequently to FIG. 5A.

In steps illustrated in FIGS. 4M and 5B, the resist 84 is removed, and the upper-portion wiring layer 32 is removed at its portions formed on the upper portion of the resist 84 through lift-off.

Figure 4N:
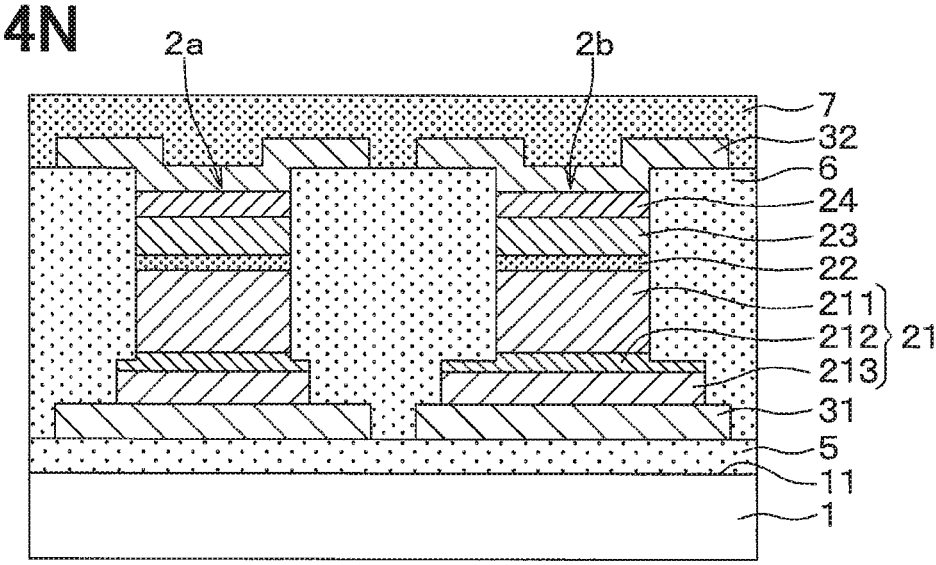
FIG. 4N is a cross-sectional view taken along the line III-III in FIG. 1, illustrating a step of manufacturing the magnetic sensor, subsequently to FIG. 4M.

In a step illustrated in FIG. 4N, a mask which exposes portions of the upper-portion wiring layer 32, which is not illustrated, is formed through photolithography, and pads 4 are formed on the surface of the upper-portion wiring layer 32 and on this mask. Thereafter, the mask is removed, and the portions of the pads 4, which are formed on the upper portion of the mask, are removed through lift-off. Further, a protective film 7 is formed on the surfaces of the upper-portion wiring layer 32, the pads 4, and the sidewall protective film 6, and the portions of the protective film 7 which are formed on the upper portions of the pads 4 are removed, through photolithography and etching, to form openings 71, thereby exposing the pads 4. This results in a cross-sectional view taken along the II-II line in FIG. 1, as illustrated in FIG. 2.

Figure 6:
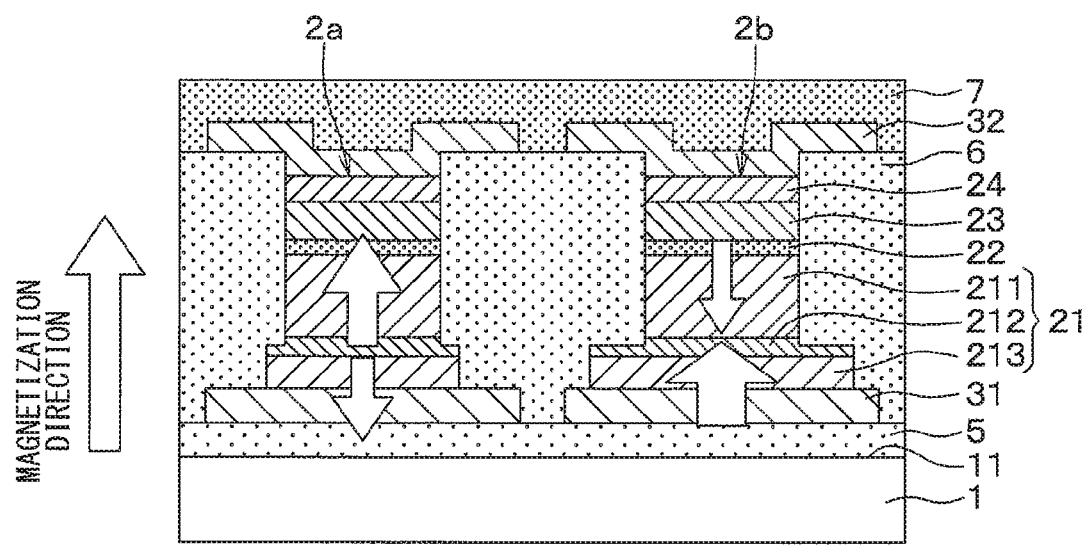
FIG. 6 is a cross-sectional view taken along the line III-III in FIG. 1, illustrating a step of manufacturing the magnetic sensor.

In a step illustrated in FIG. 6, magnetization is performed on the magnetoresistive devices 2a and 2b. More specifically, the substrate 1 is subjected to a magnetic field in the direction perpendicular to the one surface 11. Further, the magnetic field is increased in some degree and, thereafter, is returned to zero. As a result thereof, as indicated by arrows in FIG. 6, the ferromagnetic layer 211 included in each magnetoresistive device 2a has been magnetized in the direction from the ferromagnetic layer 213 to the ferromagnetic layer 211, while the ferromagnetic layer 213 has been magnetized in the direction from the ferromagnetic layer 211 to the ferromagnetic layer 213. Further, the ferromagnetic layer 211 included in each magnetoresistive device 2b has been magnetized in the direction from the ferromagnetic layer 211 to the ferromagnetic layer 213, while the ferromagnetic layer 213 has been magnetized in the direction from the ferromagnetic layer 213 to the ferromagnetic layer 211.

Figure 7:
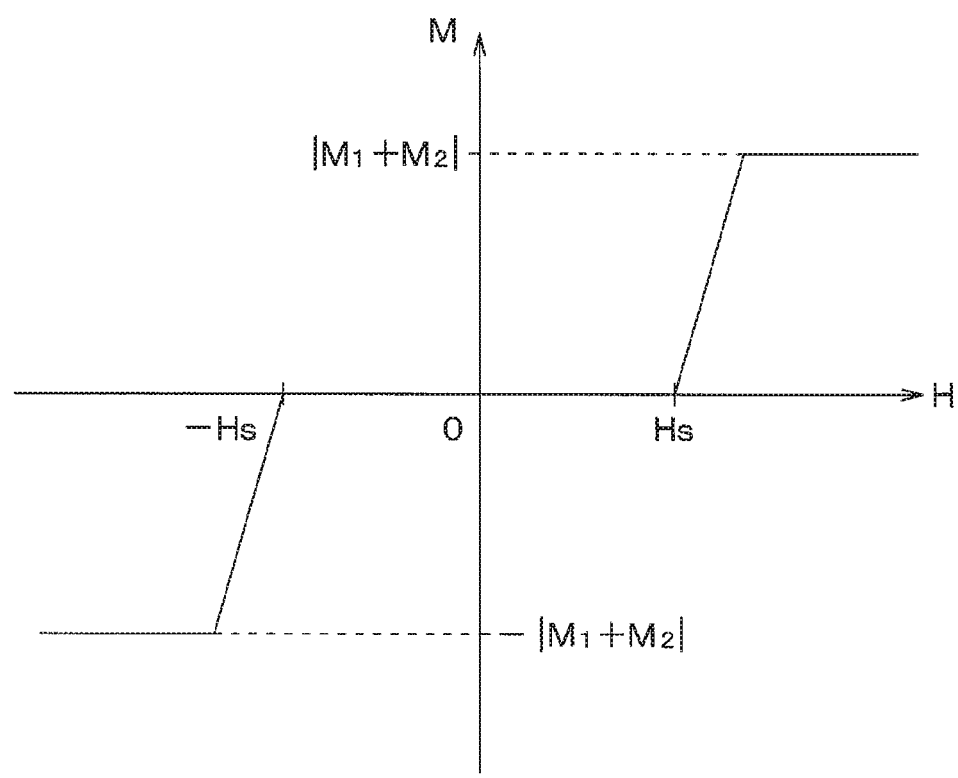
FIG. 7 is a graph illustrating a relationship between an external magnetic field and magnetization of a fixed layer, in a case where one of ferromagnetic layers and the other ferromagnetic layer are magnetized in the same amount.

There will be described the magnetization of the magnetoresistive devices 2, with reference to FIGS. 7 to 11D. If a magnetic field is applied to the fixed layer 21 including the ferromagnetic layer 211 and the ferromagnetic layer 213 which are magnetized in the same amount, and the non-magnetic layer 212 placed between these ferromagnetic layers, a magnetization curve is made as illustrated in FIG. 7.

Figure 8A:
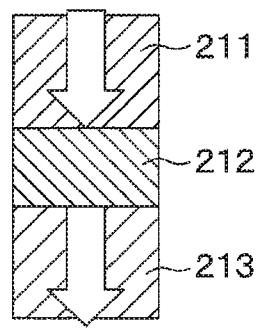
FIG. 8A is a cross-sectional view illustrating directions of magnetization, in a case where one of the ferromagnetic layers and the other ferromagnetic layer are magnetized in the same amount.

Namely, when H is smaller than −Hs, as illustrated in FIG. 8A, the ferromagnetic layers 211 and 213 are both magnetized in the negative direction. When the magnetic field H is smaller than −Hs in some degree, M is equal to −|$M_1$+$M_2$|. Incidentally, $M_1$ and $M_2$ are the respective amounts of magnetization of the ferromagnetic layers 211 and 213, M is the entire magnetization of the fixed layer 21, and H is the intensity of the magnetic field applied to the fixed layer 21. Further, regarding the directions of the magnetization and the magnetic field, it is assumed that the direction from the ferromagnetic layer 213 to the ferromagnetic layer 211, and the direction from the ferromagnetic layer 211 to the ferromagnetic layer 213 are defined as the positive direction and the negative direction, respectively.

Figure 8B:
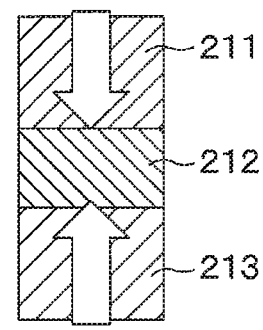
FIG. 8B is a cross-sectional view illustrating directions of magnetization, in a case where one of the ferromagnetic layers and the other ferromagnetic layer are magnetized in the same amount.
Figure 8C:
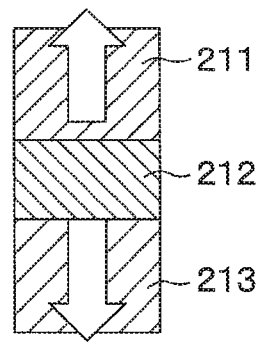
FIG. 8C is a cross-sectional view illustrating directions of magnetization, in a case where one of the ferromagnetic layers and the other ferromagnetic layer are magnetized in the same amount.

Further, when H is equal to or greater than −Hs but smaller than Hs, as illustrated in FIG. 8B, the ferromagnetic layers 211 and 213 are magnetized in the negative direction and the positive direction, respectively, or as illustrated in FIG. 8C, the ferromagnetic layers 211 and 213 are magnetized in the positive direction and the negative direction, respectively, and, thus, there is held the following relationship: M=|$M_1$−$M_2$|=0.

Figure 8D:
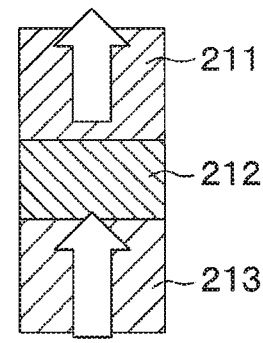
FIG. 8D is a cross-sectional view illustrating directions of magnetization, in a case where one of the ferromagnetic layers and the other ferromagnetic layer are magnetized in the same amount.

When H is equal to or greater than Hs, as illustrated in FIG. 8D, the ferromagnetic layers 211 and 213 are both magnetized in the positive direction. When the magnetic field H is larger than Hs in some degree, M is equal to |$M_1$+$M_2$|.

Figure 9:
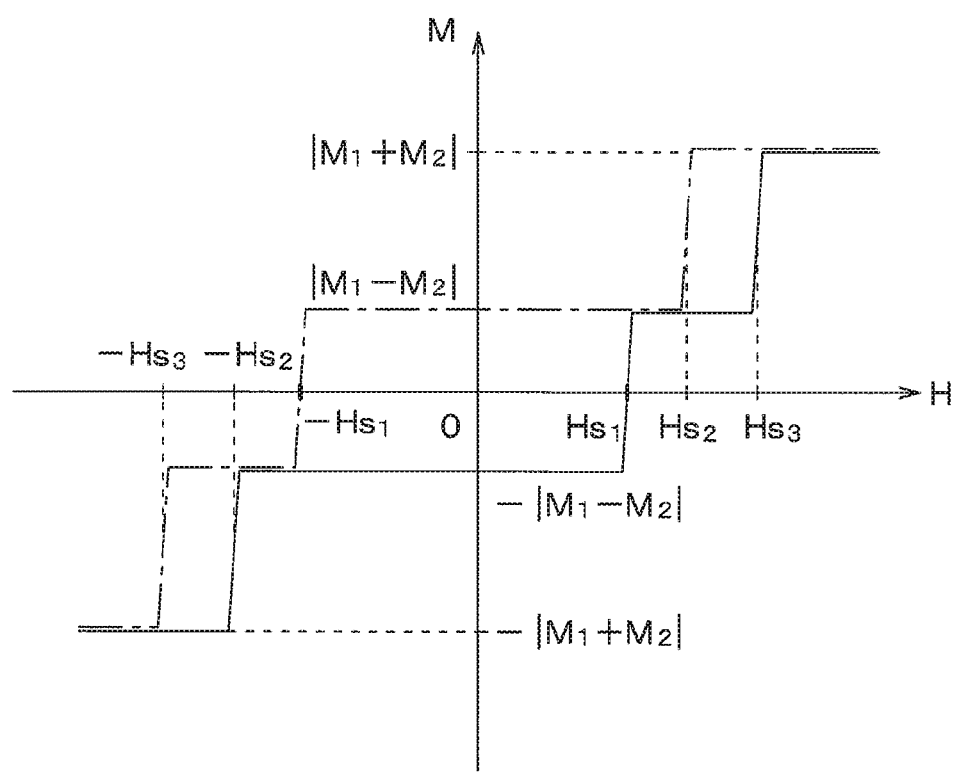
FIG. 9 is a graph illustrating a relationship between an external magnetic field and magnetization of a fixed layer, in a case where one of the ferromagnetic layers and the other ferromagnetic layer are magnetized in respective different amounts.

As described above, when the ferromagnetic layers 211 and 213 are magnetized in the same amount, M equals to zero when H equals to zero. On the other hand, when the ferromagnetic layers 211 and 213 are magnetized in amounts different from each other, a magnetization curve is made as illustrated in FIG. 9, and the ferromagnetic layers 211 and 213 are magnetized as illustrated in FIGS. 10A to 10D and FIGS. 11A to 11D, and M is not equal to zero when H is equal to zero. Further, in FIG. 9, the solid line represents a magnetization curve when the magnetic field H is increased, and the dashed chain line represents a magnetization curve when the magnetic field H is decreased, Further, FIGS. 10A to 10D represent the directions of magnetization of the ferromagnetic layers 211 and 213, in a case where the ferromagnetic layer 211 is magnetized in a larger amount than that of the ferromagnetic layer 213. Further, FIGS. 11A to 11D represent the directions of magnetization of the ferromagnetic layers 211 and 213, in a case where the ferromagnetic layer 211 is magnetized in a smaller amount than that of the ferromagnetic layer 213.

Figure 10A:
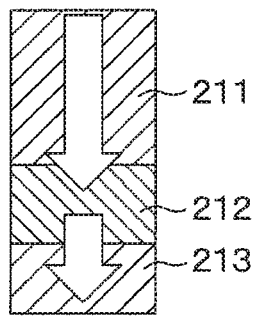
FIG. 10A is a cross-sectional view illustrating directions of magnetization, in a case where one of the ferromagnetic layers and the other ferromagnetic layer are magnetized in respective different amounts.
Figure 11A:
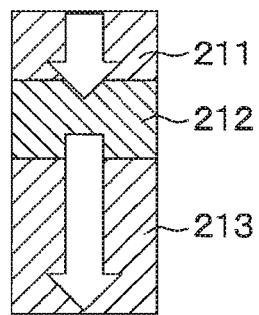
FIG. 11A is a cross-sectional view illustrating directions of magnetization, in a case where one of the ferromagnetic layers and the other ferromagnetic layer are magnetized in respective different amounts.

Namely, as the magnetic field H is increased, as illustrated in FIGS. 10A and 11A, when H is smaller than $-Hs_2$, the ferromagnetic layers 211 and 213 are both magnetized in the negative direction. When H is smaller than $-Hs_2$ in some degree, M is equal to $-|M_1+M_2|$.

Figure 10B:
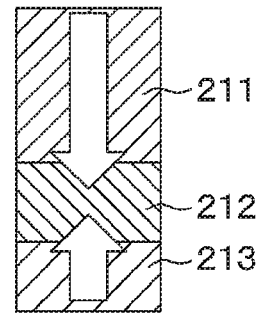
FIG. 10B is a cross-sectional view illustrating directions of magnetization, in a case where one of the ferromagnetic layers and the other ferromagnetic layer are magnetized in respective different amounts.
Figure 11B:
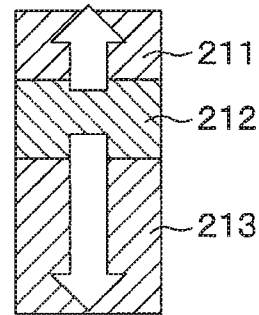
FIG. 11B is a cross-sectional view illustrating directions of magnetization, in a case where one of the ferromagnetic layers and the other ferromagnetic layer are magnetized in respective different amounts.

Further, when H is equal to or greater than $-Hs_2$ but smaller than $Hs_1$, as illustrated in FIGS. 10B and 11B, the ferromagnetic layer which is magnetized in a larger amount, out of the ferromagnetic layers 211 and 213, is magnetized in the negative direction, while the ferromagnetic layer which is magnetized in a smaller amount is magnetized in the positive direction. Further, when the magnetic field H is larger than $-Hs_2$ in some degree but is smaller than $Hs_1$ in some degree, M is equal to $-|M_1-M_2|$.

Figure 10C:
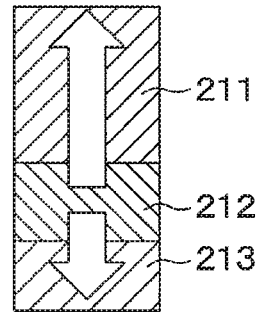
FIG. 10C is a cross-sectional view illustrating directions of magnetization, in a case where one of the ferromagnetic layers and the other ferromagnetic layer are magnetized in respective different amounts.
Figure 11C:
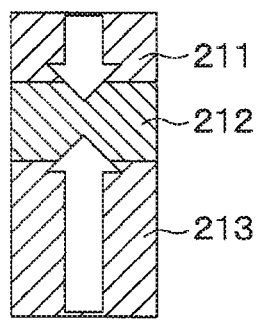
FIG. 11C is a cross-sectional view illustrating directions of magnetization, in a case where one of the ferromagnetic layers and the other ferromagnetic layer are magnetized in respective different amounts.

Further, when H is equal to or greater than $Hs_1$ but smaller than $Hs_3$, as illustrated in FIGS. 10C and 11C, the ferromagnetic layer which is magnetized in a larger amount, out of the ferromagnetic layers 211 and 213, is magnetized in the positive direction, while the ferromagnetic layer which is magnetized in a smaller amount is magnetized in the negative direction. Further, when the magnetic field H is larger than $Hs_1$ in some degree but is smaller than $Hs_3$ in some degree, M is equal to $|M_1-M_2|$.

Figure 10D:
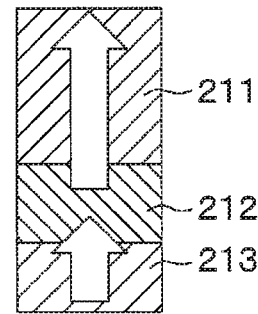
FIG. 10D is a cross-sectional view illustrating directions of magnetization, in a case where one of the ferromagnetic layers and the other ferromagnetic layer are magnetized in respective different amounts.
Figure 11D:
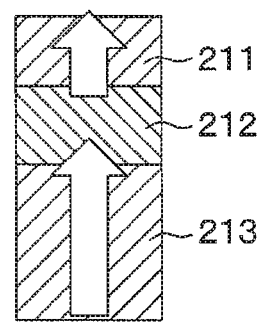
FIG. 11D is a cross-sectional view illustrating directions of magnetization, in a case where one of the ferromagnetic layers and the other ferromagnetic layer are magnetized in respective different amounts.

Further, when H is greater than $Hs_3$, as illustrated in FIGS. 10D and 11D, the ferromagnetic layers 211 and 213 are both magnetized in the positive direction. When H is greater than $Hs_3$ in some degree, M is equal to $|M_1+M_2|$.

On the other hand, as the magnetic field H is decreased, as illustrated in FIGS. 10D and 11D, when H is greater than $Hs_2$, the ferromagnetic layers 211 and 213 are both magnetized in the positive direction. When H is greater than $Hs_2$ in some degree, M is equal to $|M_1+M_2|$.

Further, when H is greater than $-Hs_1$ but equal to or smaller than $Hs_2$, as illustrated in FIGS. 10C and 11C, the ferromagnetic layer which is magnetized in a larger amount, out of the ferromagnetic layers 211 and 213, is magnetized in the positive direction, while the ferromagnetic layer which is magnetized in a smaller amount is magnetized in the negative direction. Further, when the magnetic field H is larger than $-Hs_1$ in some degree but is smaller than $Hs_2$ in some degree, M is equal to $M_1-M_2|$.

Further, when H is greater than $-Hs_3$ but equal to or smaller than $-Hs_1$, as illustrated in FIGS. 10B and 11B, the ferromagnetic layer which is magnetized in a larger amount, out of the ferromagnetic layers 211 and 213, is magnetized in the negative direction, while the ferromagnetic layer which is magnetized in a smaller amount is magnetized in the positive direction. Further, when the magnetic field H is larger than $-Hs_3$ in some degree but is smaller than $-Hs_1$ in some degree, M is equal to $-M_1-M_2|$.

Further, when H is equal to or smaller than $-Hs_3$, as illustrated in FIGS. 10A and 11A, the ferromagnetic layers 211 and 213 are both magnetized in the negative direction. When H is smaller than $-Hs_3$ in some degree, M is equal to $-M_1+M_2|$.

As described above, in the fixed layer having the antiferromagnetic coupling configuration, out of the two ferromagnetic layers coupled to each other with the non-magnetic layer interposed therebetween, the layer which is magnetized in a larger amount is magnetized in the same direction as that of the external magnetic field applied thereto during the magnetization. Further, the layer which is magnetized in a smaller amount is magnetized in the opposite direction from that of the layer which is magnetized in a larger amount, due to the antiferromagnetic coupling.

In the present embodiment, utilizing the aforementioned magnetization characteristic, the ferromagnetic layers 211 in the magnetoresistive devices 2a and 2b are magnetized in the directions opposite from each other, by performing magnetization thereon once. More specifically, the magnetic field H is increased to be larger than $Hs_1$ and, thereafter, is returned to zero, so that the ferromagnetic layers 211 and 213 in the magnetoresistive devices 2a are magnetized in the positive and negative directions, respectively, and the ferromagnetic layers 211 and 213 in the magnetoresistive devices 2b are magnetized in the negative and positive directions, respectively.

As described above, in the present embodiment, the magnitude correlation in amount of magnetization between the ferromagnetic layers 211 and 213 in the magnetoresistive devices 2a is opposite from that between the ferromagnetic layers 211 and 213 in the magnetic resistance devices 2b, This enables magnetizing the ferromagnetic layers 211 included in the magnetoresistive devices 2a and 2b in the directions opposite from each other, by performing magnetization thereon once. This can simplify the process for manufacturing the magnetic sensor including the plural magnetoresistive devices with vertical magnetic anisotropy which are formed in the same chip, such that the magnetoresistive devices include the respective fixed layers magnetized in directions opposite from each other. Further, this can shorten the time period required for manufacturing the magnetic sensor and also can reduce the manufacturing cost.

Further, in the present embodiment, the ferromagnetic layers 211 and 213 in the magnetoresistive devices 2a and 2b are formed from the same material and are magnetized in the same amount per unit volume. This enables controlling the directions of magnetization of the ferromagnetic layers 211, by controlling the areas of the upper surfaces of the ferromagnetic layers 211, the areas of the bottom surfaces of the ferromagnetic layers 213, and the film thicknesses of the ferromagnetic layers 211 and 213. This makes it easier to manufacture the magnetic sensor 100.

Further, it is desirable that the ferromagnetic layers 211 in the magnetoresistive devices 2a and the ferromagnetic layers 211 in the magnetoresistive devices 2b be formed at the same time. Further, it is also desirable that the ferromagnetic layers 213 in the magnetoresistive devices 2a and the ferromagnetic layers 213 in the magnetoresistive devices 2b be formed at the same time. By forming these layers at the same time, it is possible to make the ferromagnetic layers 211 and 213 in the magnetoresistive devices 2a and 2b have the same film thicknesses, which can suppress variations among the devices, thereby reducing measurement errors.

Further, it is also desirable that $S_{A1}$ be equal to $S_{B1}$, in order to reduce the difference in resistance value between the magnetoresistive devices 2a and 2b and in order to reduce etching rate variations in the step illustrated in FIG. 4I.

Second Embodiment

A second embodiment will be described. In the present embodiment, the number of magnetoresistive devices 2 is changed from that in the first embodiment, and the others are the same as those in the first embodiment. Therefore, the present embodiment will be described regarding portions thereof, which are different from those in the first embodiment.

A magnetic sensor 100 according to the present embodiment includes four magnetoresistive devices 2a and four magnetoresistive devices 2b. It is assumed that the four magnetoresistive devices 2a are respective magnetoresistive devices 2a1, 2a2, 2a3 and 2a4, and the four magnetoresistive devices 2b are respective magnetoresistive devices 2b1, 2b2, 2b3 and 2b4.

Figure 12:
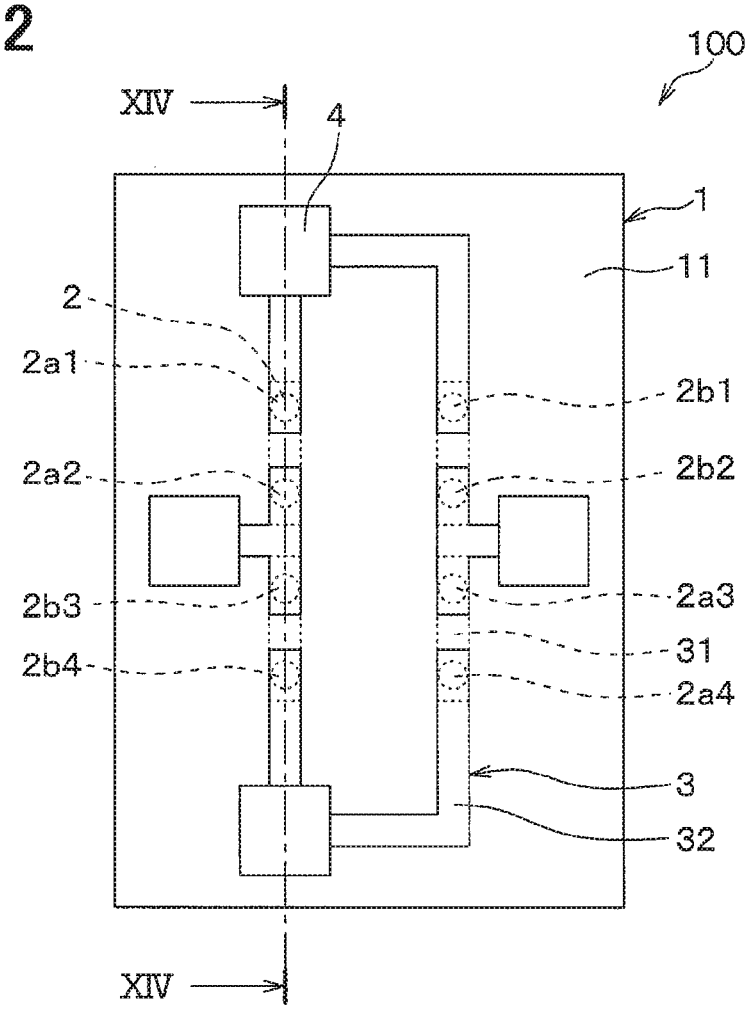
FIG. 12 is a plan view of a magnetic sensor according to a second embodiment.
Figure 13:
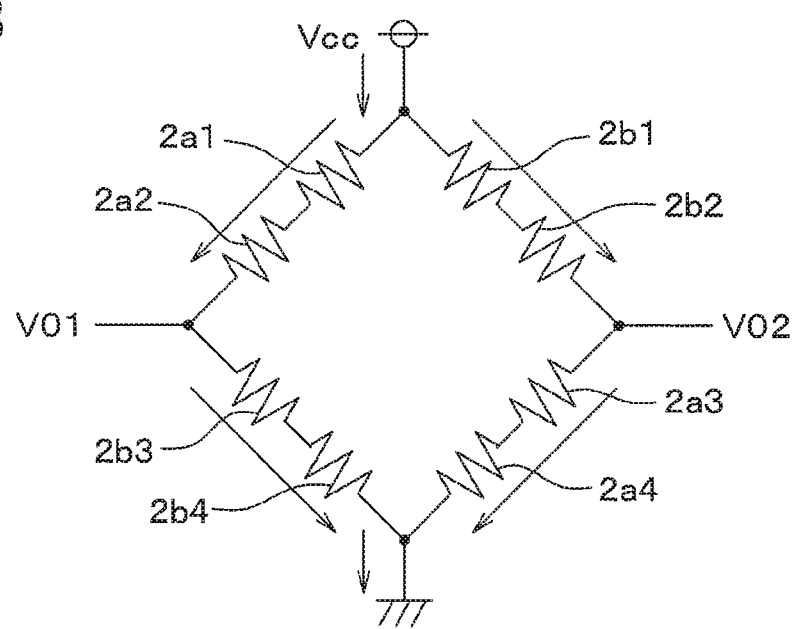
FIG. 13 is a circuit diagram of the magnetic sensor according to the second embodiment.

As illustrated in FIG. 12, the four magnetoresistive devices 2a and the four magnetoresistive devices 2b are electrically connected to each other through wirings 3 to form a Wheatstone bridge (full bridge) circuit illustrated in FIG. 13. Further, in FIG. 12, there is not illustrated a protective film 7.

Namely, between a positive electrode and a negative electrode (ground) in a power source which is not illustrated, two of the magnetoresistive devices 2a and two of the magnetoresistive devices 2b are connected to each other in series, such that the magnetoresistive devices 2a are on the positive-electrode side. Further, in parallel to the aforementioned magnetoresistive devices, between the positive electrode and the negative electrode in the power source, the other two magnetoresistive devices 2a and the other two magnetoresistive devices 2b are placed such that the magnetoresistive devices 2b are on the positive-electrode side.

More specifically, cap layers 24 in the magnetoresistive devices 2a1 and 2b1 are connected to the positive electrode of the power source which is not illustrated, through an upper-portion wiring layer 32. Ferromagnetic layers 213 in the magnetoresistive devices 2a1 and 2b1 are connected to ferromagnetic layers 213 in the magnetoresistive devices 2a2 and 2b2, respectively, through a lower-portion wiring layer 31. Cap layers 24 in the magnetoresistive devices 2a2 and 2b2 are connected to cap layers 24 in the magnetoresistive devices 2b3 and 2a3, respectively, through the upper-portion wiring layer 32. Ferromagnetic layers 213 in the magnetoresistive devices 2b3 and 2a3 are connected to ferromagnetic layers 213 in the magnetoresistive devices 2b4 and 2a4, respectively, through the lower-portion wiring layer 31. Cap layers 24 in the magnetoresistive devices 2b4 and 2a4 are connected to the negative electrode of the power supply which is not illustrated, through the upper-portion wiring layer 32.

Further, as illustrated in FIG. 12, the magnetic sensor 100 according to the present embodiment includes four pads 4. Two of the four pads 4 are used for connecting the bridge circuit to the power supply, which is not illustrated, and are formed on the respective upper surfaces of the portion of the upper-portion wiring layer 32 which is connected to the magnetoresistive devices 2a1 and 2b1 and the portion of the upper-portion wiring layer 32 which is connected to the magnetoresistive devices 2a4 and 2b4. Further, the other two pads 4 are used for determining the electric potential difference between a connection point between the magnetoresistive devices 2a2 and 2b3 and a connection point between the magnetoresistive devices 2b2 and 2a3. Further, these two pads 4 are formed on the respective upper surfaces of the portion of the upper-portion wiring layer 32, which is connected to the magnetoresistive devices 2a2 and 2b3, and the portion of the upper-portion wiring layer 32, which is connected to the magnetoresistive devices 2b2 and 2a3.

Figure 14:
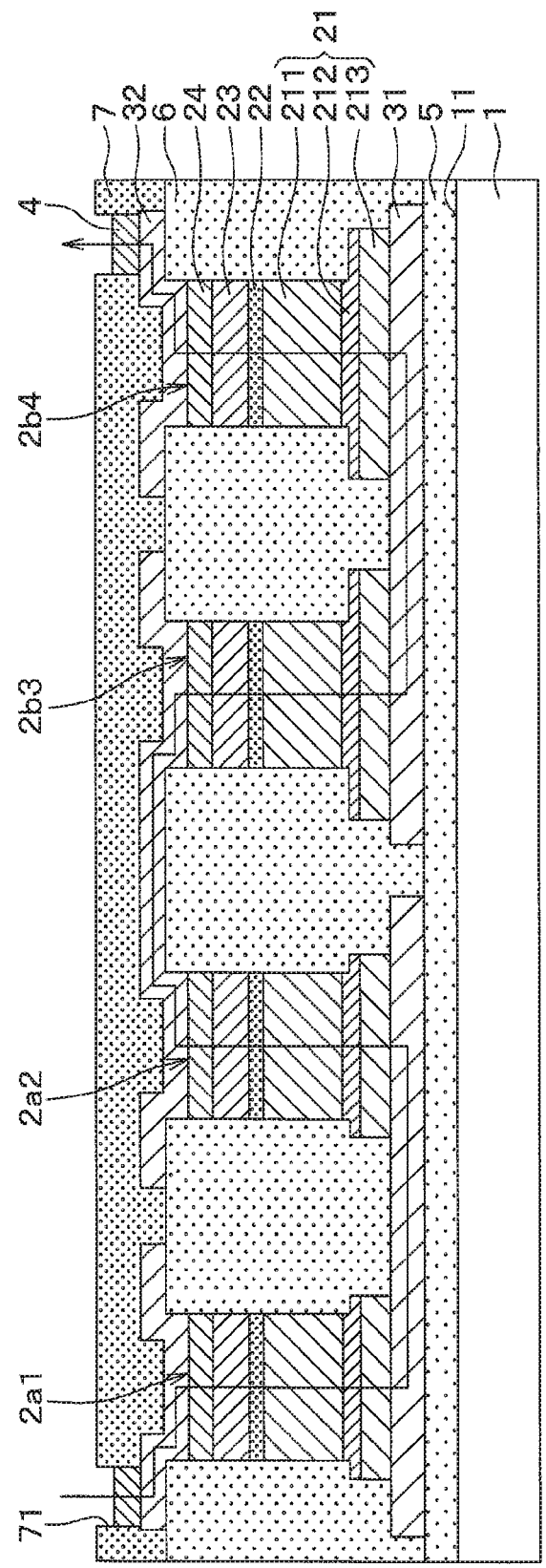
FIG. 14 is a cross-sectional view taken along XIV-XIV in FIG. 12.

By applying a predetermined voltage Vcc between the positive electrode and the negative electrode of the power supply, in the aforementioned structure, an electric current is flowed as illustrated in arrows in FIGS. 13 and 14.

Figure 15:
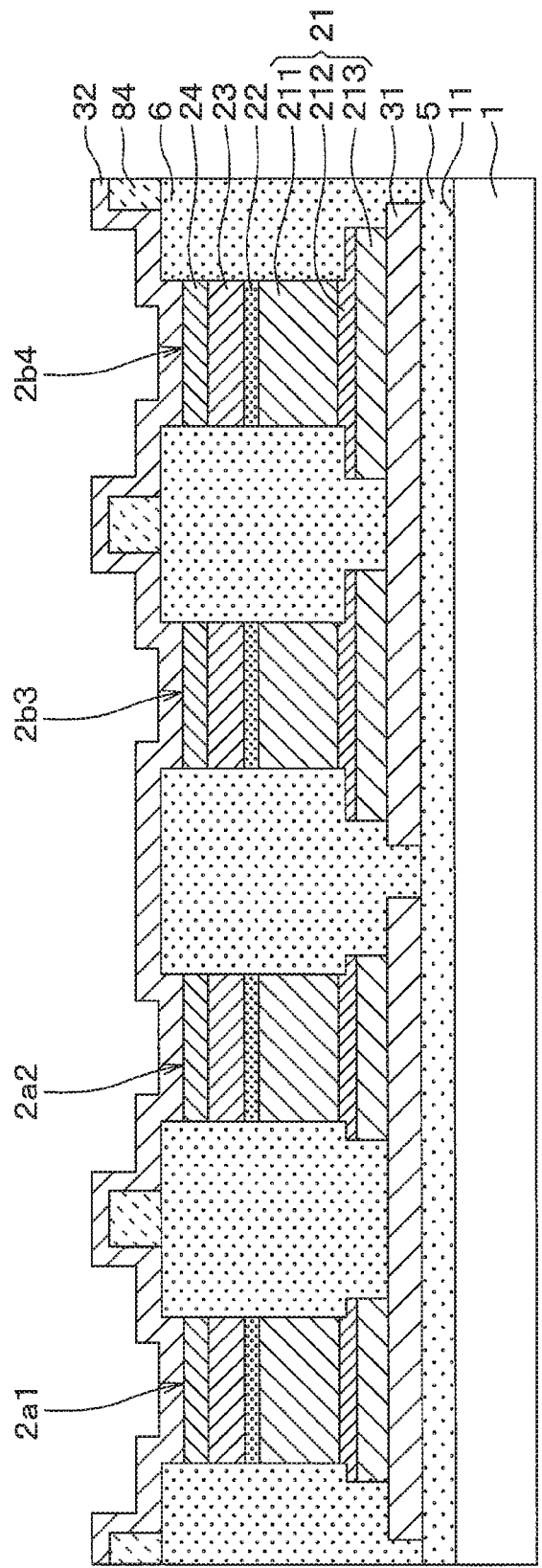
FIG. 15 is a cross-sectional view illustrating a step of manufacturing the magnetic sensor.

In order to manufacture the aforementioned magnetic sensor 100, at first, similarly to in the steps illustrated in FIGS. 4A to 4K, a lower-portion wiring layer 31 having the same shape as that illustrated in FIG. 12, and respective magnetoresistive devices 2 are formed. Thereafter, as illustrated in FIG. 15, a resist 84 having a shape conforming to the upper-portion wiring layer 32 illustrated in FIG. 12 is formed, and an upper-portion wiring layer 32 is formed on the surfaces of the cap layer 24, the sidewall protective film 6, and the resist 84. Further, the resist 84 is removed, and the portions of the upper-portion wiring layer 32, which are formed on the upper portion of the resist 84, are removed through lift-off, thereby forming a Wheatstone bridge circuit. Thereafter, pads 4 and a protective film 7 are formed, and magnetization is performed thereon similarly to in the step illustrated in FIG. 6.

The resistance value of each magnetoresistive device 2 is varied, depending on the direction of magnetization of the ferromagnetic layer 211 which is in contact with the intermediate layer 22. Accordingly, the output characteristics of the resistance value of each magnetoresistive device 2 is reversed, by reversing the direction of magnetization of the ferromagnetic layer 211. Therefore, by detecting magnetic fields based on the difference between the electric potential V01 at the connection point between the magnetoresistive devices 2a2 and 2b3 and the electric potential V02 at the connection point between the magnetoresistive devices 2b2 and 2a3, it is possible to alleviate influences of external disturbances such as temperature changes.

Also in cases of forming a bridge circuit for compensating temperature characteristics on a single chip as described above, it is possible to simplify the process for manufacturing the magnetic sensor 100, similarly to in the first embodiment, by making the magnitude correlation in amount of magnetization between the ferromagnetic layers 211 and 213 in the magnetoresistive devices 2a opposite from that between the ferromagnetic layers 211 and 213 in the magnetoresistive devices 2b.

Third Embodiment

A third embodiment will be described. In the present embodiment, an etching stop layer is constituted by a different layer from that in the first embodiment, and the others are the same as those in the first embodiment. Therefore, the present embodiment will be described regarding only portions thereof, which are different from those in the first embodiment.

Figure 16:
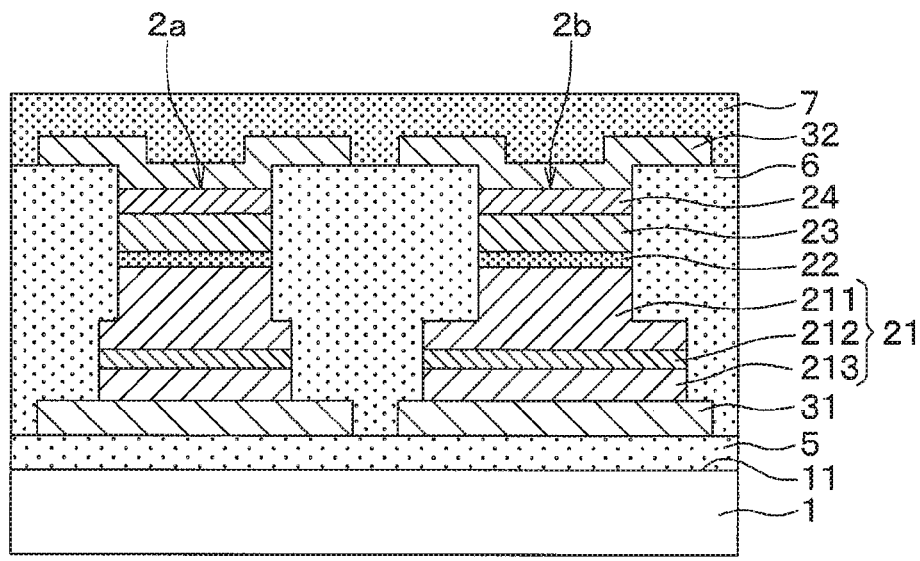
FIG. 16 is a cross-sectional view of a magnetic sensor according to a third embodiment.

In the present embodiment, as illustrated in FIG. 16, a ferromagnetic layer 211 is utilized as the etching stop layer. Namely, during etching utilizing a resist 83, if an element forming the ferromagnetic layer 211 is detected in the atmosphere, then the etching is stopped, and a cap layer 24, a free layer 23, an intermediate layer 22, and a portion of the ferromagnetic layer 211 are removed. Thus, the ferromagnetic layer 211 is made to have a stepped circular cylindrical shape having a bottom surface with an area larger than that of its upper surface.

Generally, an antiferromagnetic coupling configuration is adapted such that ferromagnetic layers placed on the opposite sides of a non-magnetic layer are made to have larger thicknesses than that of the non-magnetic layer. Accordingly, by utilizing the ferromagnetic layer 211 as the etching stop layer, it is possible to make it easier to control the etching depth, thereby making it easier to manufacture the magnetic sensor 100.

Fourth Embodiment

A fourth embodiment will be described. In the present embodiment, an etching stop layer is constituted by a different layer from that in the first embodiment, and the others are the same as those in the first embodiment. Therefore, the present embodiment will be described regarding only portions thereof, which are different from those in the first embodiment.

Figure 17:
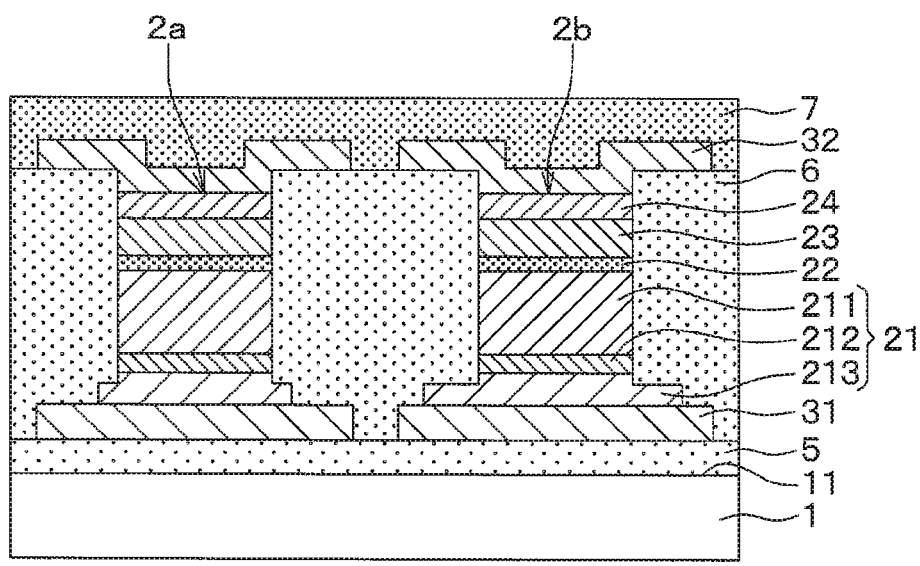
FIG. 17 is a cross-sectional view of a magnetic sensor according to a fourth embodiment.

In the present embodiment, as illustrated in FIG. 17, a ferromagnetic layer 213 is utilized as the etching stop layer. Namely, during etching utilizing a resist 83, if an element forming the ferromagnetic layer 213 is detected in the atmosphere, then the etching is stopped, and a cap layer 24, a free layer 23, an intermediate layer 22, a ferromagnetic layer 211, a non-magnetic layer 212, and a portion of the ferromagnetic layer 213 are removed. Thus, the ferromagnetic layer 213 is made to have a stepped circular cylindrical shape having a bottom surface with an area larger than that of its upper surface.

Also in the present embodiment where the ferromagnetic layer 213 is utilized as the etching stop layer, it is possible to make it easier to control the etching depth, thereby making it easier to manufacture the magnetic sensor 100, similarly to in the third embodiment.

Other Embodiments

Further, the present disclosure is not limited to the aforementioned embodiments, and changes can be made thereto as required. Further, the aforementioned embodiments are not unrelated to each other and can be combined with each other as required, unless it is obviously impossible to combine them with each other. Further, it goes without saying that, in the aforementioned embodiments, the elements constituting the embodiments are not necessarily essential, unless they are particularly specified as being essential or unless they are obviously considered to be essential in principle. Further, in the aforementioned embodiments, in cases where the numbers of constituents according to the embodiments, numerical values, amounts, ranges, and other numerical values are mentioned, the present disclosure is not limited to these certain numerical values, unless they are particularly specified as being essential or unless the present disclosure should be obviously limited to these certain numerical values in principle. Further, in the aforementioned embodiments, in cases where the shapes, the positional relationships, and the like of constituents and the like are mentioned, the present disclosure is not limited to these shapes, positional relationships, and the like, unless otherwise specified or unless the present disclosure should be obviously limited to certain shapes, positional relationships and the like in principle.

For example, provided that $M_{A2}$ is smaller than $M_{A1}$, and $M_{B1}$ is smaller than $M_{B2}$, the ferromagnetic layers 211 and 213 may have different configurations from those in the aforementioned first to fourth embodiments. For example, the ferromagnetic layers 211 and 213 can be also formed from respective different materials, and $Ms_{A1}$ may be made unequal to $Ms_{A2}$ or $Ms_{B1}$ can be made unequal to $Ms_{B2}$. Further, $Ms_{A2}$ can be made smaller than $MS_{A1}$ and $V_{A1}$ can be made equal to $V_{A2}$. Further, $Ms_{B1}$ can be made smaller than $Ms_{B2}$ and $V_{B1}$ may be made equal to $V_{B2}$. Further, $S_{A1}$ can be made unequal to $S_{B1}$. Further, $t_{A1}$ can be made unequal to $t_{B1}$ or $t_{A2}$ may be made unequal to $t_{B2}$. Further, $S_{A1}$ can be made equal to $S_{A2}$ or $S_{B1}$ may be made equal to $S_{B2}$.

Further, in order to detect magnetic-field intensities over a wider magnetic-field range, in detecting external magnetic fields in the direction perpendicular to the one surface 11, it is desirable that the free layer 23 have an axis of easy magnetization parallel to the one surface 11. However, the free layer 23 may not have an axis of easy magnetization parallel to the one surface 11. For example, the free layer 23 may have an axis of easy magnetization perpendicular to the one surface 11.

Further, the magnetic sensor 100 may include only one magnetoresistive device 2a or only one magnetoresistive device 2b. Further, each of the layers forming the magnetoresistive devices 2 may not have an upper surface having a circular shape.

Further, during the magnetization of the fixed layers 21, the magnetic field H may be decreased to be smaller than $-Hs_1$ and, thereafter, may be returned to zero, to magnetize the ferromagnetic layers 211 included in the magnetoresistive devices 2a in the negative direction and to magnetize the ferromagnetic layers 211 included in the magnetoresistive devices 2b in the positive direction. Further, in the aforementioned second embodiment, the two magnetoresistive devices 2a and the two magnetoresistive devices 2b may form a Wheatstone bridge circuit. Also, only the magnetoresistive devices 2a and 2b which form a half-bridge circuit may be formed on the substrate 1.

Also, the fixed layers 21 are not necessarily required to have an axis of easy magnetization which is completely perpendicular to the one surface 11 and may also have an axis of easy magnetization which is substantially perpendicular to the one surface 11.

What is claimed is:
1. A magnetic sensor comprising:
   a substrate: and
   a first magnetoresistive device and a second magnetoresistive device that are arranged on one surface of the substrate, wherein:
   each of the first magnetoresistive device and the second magnetoresistive device includes:
      a fixed layer having an easy magnetization axis perpendicular to the one surface and having a fixed magnetization direction;
      a free layer having a variable magnetization direction; and
      an intermediate layer made of a non-magnetic material and arranged between the fixed layer and the free layer;
   the fixed layer includes a first ferromagnetic layer, a second ferromagnetic layer, and a non-magnetic layer arranged between the first ferromagnetic layer and the second ferromagnetic layer;
   the first ferromagnetic layer and the second ferromagnetic layer are made of a same material;
   the first ferromagnetic layer in the first magnetoresistive device has a volume larger than a volume of the second ferromagnetic layer in the first magnetoresistive device; and
   the first ferromagnetic layer in the second magnetoresistive device has a volume smaller than a volume of the second ferromagnetic layer in the second magnetoresistive device.
2. The magnetic sensor according to claim 1, wherein:
   the first ferromagnetic layer in the first magnetoresistive device has a magnetization direction opposite to a magnetization direction of the first ferromagnetic layer in the second magnetoresistive device.

3. The magnetic sensor according to claim 1, wherein:
the first ferromagnetic layer in the first magnetoresistive device has a thickness equal to a thickness of the first ferromagnetic layer in the second magnetoresistive device;
the second ferromagnetic layer in the first magnetoresistive device has a thickness equal to a thickness of the second ferromagnetic layer in the second magnetoresistive device;
the first ferromagnetic layer in the first magnetoresistive device has an upper surface with an area smaller than an area of a bottom surface of the second ferromagnetic layer in the first magnetoresistive device; and
the first ferromagnetic layer in the second magnetoresistive device has an upper surface with an area smaller than an area of a bottom surface of the second ferromagnetic layer in the second magnetoresistive device.

4. The magnetic sensor according to claim 1, wherein:
the first ferromagnetic layer in the first magnetoresistive device has an upper surface with an area equal to an area of an upper surface of the first ferromagnetic layer in the second magnetoresistive device.

5. The magnetic sensor according to claim 1, wherein:
the free layer has an easy magnetization axis in parallel to the one surface.

6. The magnetic sensor according to claim 1, wherein:
the non-magnetic layer has a bottom surface with an area larger than an area of an upper surface of the non-magnetic layer.

7. The magnetic sensor according to claim 1, wherein:
the first ferromagnetic layer has a bottom surface with an area larger than an area of an upper surface of the first ferromagnetic layer.

8. The magnetic sensor according to of claim 1, wherein:
the second ferromagnetic layer has a bottom surface with an area larger than an area of an upper surface of the second ferromagnetic layer.

9. The magnetic sensor according to claim 1, further comprising:
another first magnetoresistive device and another second magnetoresistive device, wherein:
two of the first magnetoresistive device and the other first magnetoresistive device and two of the second magnetoresistive device and the other second magnetoresistive device provide a Wheatstone bridge circuit.

* * * * *